· US 8,052,834 B2

(12) United States Patent
Yoshida et al.

(10) Patent No.: US 8,052,834 B2
(45) Date of Patent: *Nov. 8, 2011

(54) SUBSTRATE TREATING SYSTEM, SUBSTRATE TREATING DEVICE, PROGRAM, AND RECORDING MEDIUM

(75) Inventors: Takushi Yoshida, Kyoto (JP); Masaya Washio, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 369 days.

This patent is subject to a terminal disclaimer.

(21) Appl. No.: 10/541,507

(22) PCT Filed: Dec. 25, 2003

(86) PCT No.: PCT/JP03/16679
§ 371 (c)(1),
(2), (4) Date: Jul. 8, 2005

(87) PCT Pub. No.: WO2004/064134
PCT Pub. Date: Jul. 29, 2004

(65) Prior Publication Data
US 2006/0151112 A1  Jul. 13, 2006

(30) Foreign Application Priority Data
Jan. 9, 2003   (JP) .................................. 2003-003131

(51) Int. Cl.
*H01L 21/027* (2006.01)
*G05B 23/02* (2006.01)
(52) U.S. Cl. ......... 156/345.55; 156/345.15; 156/345.24; 134/113; 118/730
(58) Field of Classification Search .............. 156/345.55, 156/345.13, 345.15, 345, 345.24; 134/113, 134/902; 118/712, 730
See application file for complete search history.

(56) References Cited

U.S. PATENT DOCUMENTS 5,726,912 A * 3/1998 Krall et al. ..................... 702/186
6,145,519 A * 11/2000 Konishi et al. ............... 134/95.2
6,431,184 B1 * 8/2002 Taniyama ....................... 134/1.3
(Continued)

FOREIGN PATENT DOCUMENTS
JP   06331507 A  * 12/1994
JP   08-145300      6/1996
JP   11-3117        1/1999
JP   11-87297 A    3/1999
JP   11338848 A  * 12/1999
(Continued)

OTHER PUBLICATIONS
International Search Report PCT/JP03/16679 dated Mar. 24, 2004.

*Primary Examiner* — Sylvia R. MacArthur
(74) *Attorney, Agent, or Firm* — Ostrolenk Faber LLP

(57) ABSTRACT

Of process steps of polymer removal in a substrate processing apparatus (3), in a step of discharging and spreading a removal solution to coat a rotating substrate (W), data indicative of the number of revolutions of a substrate, the temperature and flow rate of a removal solution, and removal solution discharge time is collected and a combination thereof is synthetically assessed to detect a processing abnormality. In a pure water discharge step, data indicative of the number of revolutions of a substrate, the flow rate of pure water and pure water discharge time is collected and a combination thereof synthetically assessed to detect a processing abnormality. Thus, a processing abnormality in polymer removal is detected based on a combination of important control elements in important steps largely exerting influence on the results of processing, thereby allowing detection of a processing abnormality with a higher degree of accuracy.

18 Claims, 12 Drawing Sheets

U.S. PATENT DOCUMENTS

| | | | |
|---|---|---|---|
| 6,464,799 B1 | 10/2002 | Lerner et al. | 134/18 |
| 6,487,472 B1 * | 11/2002 | Song et al. | 700/121 |
| 6,772,045 B2 * | 8/2004 | Katsui et al. | 700/207 |
| 6,902,647 B2 * | 6/2005 | Hasper | 156/345.31 |
| 7,047,093 B2 * | 5/2006 | Nakamoto et al. | 700/95 |
| 7,591,922 B2 * | 9/2009 | Okamoto | 156/345.18 |
| 2001/0009157 A1 * | 7/2001 | Maekawa et al. | 134/113 |
| 2004/0002784 A1 * | 1/2004 | Yoshida et al. | 700/108 |

FOREIGN PATENT DOCUMENTS

| | | |
|---|---|---|
| JP | 2000-015082 | 1/2000 |
| JP | 2000-021838 | 1/2000 |
| JP | 2000-183018 A | 6/2000 |
| JP | 2002-205022 A | 7/2002 |
| JP | 2002-208581 A | 7/2002 |
| JP | 2003-005826 | 1/2003 |
| JP | 2004-025057 | 1/2004 |

* cited by examiner

SUBSTRATE TREATING SYSTEM, SUBSTRATE TREATING DEVICE, PROGRAM, AND RECORDING MEDIUM

CROSS REFERENCE TO RELATED APPLICATION

The present application is a 35 U.S.C. §371 national phase conversion of PCT/JP2003/016679, filed Dec. 25, 2003, which claims priority to Japanese Patent Application No: 2003-3131, filed Jan.9, 2003. The PCT International Application was published in the Japanese language.

TECHNICAL FIELD

The present invention relates to a substrate processing apparatus in which a processing solution is discharged onto a rotating semiconductor substrate, a glass substrate for a liquid crystal display, a glass substrate for a photomask, a substrate for an optical disk and the like (hereinafter simply referred to as "substrates") to perform predetermined processing thereon, and to a network communication technology having coupling through a network between the substrate processing apparatus and a computer collecting data of the substrate processing apparatus.

BACKGROUND ART

Products such as semiconductor or liquid crystal displays are manufactured by a series of process steps including cleaning, resist coating, exposure, development, etching, formation of an interlayer insulating film, thermal processing on substrates. These process steps are generally performed in a substrate processing apparatus incorporating a plurality of processing units. In the substrate processing apparatus, a transport robot sequentially transports a substrate between the processing units at which a substrate is subjected to a predetermined process to experience a series of process steps.

Conventionally, these processing units, transport robot and the like are each provided with various types of sensors for monitoring operations and process conditions thereof. These sensors detect an abnormality in substrate processing, an exemplary technique of which is disclosed in Japanese Patent Application Laid-Open No. 11-3117. Various types of sensors monitor respective targets. When any one of the respective targets goes out of a predetermined range, a corresponding one of the sensors sends an abnormality detecting signal so that a processing abnormality is detected.

An apparatus for removing polymer is an exemplary substrate processing apparatus in which polymers deposited on a substrate which are generated as a result of transformation of a resist in dry etching using reactive ions are removed by cleaning. In such a polymer removal apparatus, sensors detect the number of revolutions of a spin motor for rotating a substrate, the flow rate of a polymer removal solution and the like. In the event that any one of these values goes out of a predetermined range, a corresponding sensor sends an abnormality detecting signal.

However, a combination of a plurality of factors synthetically acts to obtain the results of substrate processing. For example, the number of revolutions of a spin motor even going out of a predetermined range may cause no abnormality of the results of processing as a result of combination with other control elements.

Conversely, even when all control elements fall within their predetermined ranges, a plurality of control elements as a combination may cause an abnormality of the results of processing. In this case, no abnormality detecting signal is sent from each sensor and hence, a processing abnormality should be detected in an inspection step to be performed after a series of substrate process steps is completed.

That is, even with various types of sensors provided to each processing unit, transport robot and the like, processing giving rise to no problem as a whole may be detected as a processing abnormality, or processing containing an abnormality may not be detected as an abnormality. Thus, it has been difficult to detect a processing abnormality with a high degree of accuracy by monitoring the operation of each processing unit.

DISCLOSURE OF THE INVENTION

The present invention is intended for a substrate processing system having coupling through a network between a substrate processing apparatus discharging a processing solution onto a rotating substrate to perform predetermined processing, and a computer collecting data from the substrate processing apparatus.

According to the present invention, the substrate processing system comprises: a collection part for monitoring and collecting a plurality of control elements in a specific step as one of processes of the predetermined processing in the substrate processing apparatus; and an abnormality detection part for detecting a processing abnormality in the substrate processing apparatus based on the plurality of control elements collected by the collection part.

The plurality of control elements in a specific step as one of processes of the predetermined processing are monitored and collected in the substrate processing apparatus, and a processing abnormality is detected in the substrate processing apparatus based on the plurality of collected control elements. Thus a processing abnormality can be readily detected with a high degree of accuracy.

According to one aspect of the present invention, the substrate processing apparatus discharges a cleaning solution and thereafter discharges pure water onto a rotating substrate to perform cleaning of the substrate, the collection part monitors and collects a plurality of control elements in a cleaning solution spread step in which the cleaning solution is discharged and spread to coat a rotating substrate, and the abnormality detection part detects a processing abnormality in the cleaning based on a combination of two or more of the plurality of control elements in the cleaning solution spread step including the number of revolutions of a substrate, the temperature, flow rate and concentration of a cleaning solution, and cleaning solution discharge time.

A processing abnormality in the cleaning is detected based on a combination of two or more of the plurality of control elements. Thus a processing abnormality can be detected with a higher degree of accuracy as compared to the case where each control element is independently assessed.

The present invention is also intended for a substrate processing apparatus discharging a processing solution onto a rotating substrate to perform predetermined processing.

According to the present invention, the substrate processing apparatus comprises: a collection part for monitoring and collecting a plurality of control elements in a specific step as one of processes of the predetermined processing; and an abnormality detection part for detecting a processing abnormality in the processes based on the plurality of control elements collected by the collection part.

The plurality of control elements in a specific step as one of processes of the predetermined processing are monitored and collected, and a processing abnormality is detected in the processes based on the plurality of collected control elements. Thus a processing abnormality can be readily detected with a high degree of accuracy.

According to one aspect of the present invention, the predetermined processing is cleaning by discharging a cleaning solution and thereafter discharging pure water onto a rotating substrate to clean the substrate, the collection part monitors and collects a plurality of control elements in a cleaning solution spread step in which the cleaning solution is discharged and spread to coat a rotating substrate, and the abnormality detection part detects a processing abnormality in the cleaning based on a combination of two or more of the plurality of control elements in the cleaning solution spread step including the number of revolutions of a substrate, the temperature, flow rate and concentration of a cleaning solution, and cleaning solution discharge time.

A processing abnormality in the cleaning is detected based on a combination of two or more of the plurality of control elements. Thus a processing abnormality can be detected with a higher degree of accuracy as compared to the case where each control element is independently assessed.

It is therefore an object of the present invention to provide a substrate processing technique capable of readily detecting a processing abnormality with a high degree of accuracy.

BEST MODE FOR CARRYING OUT THE INVENTION

Embodiments of the present invention will be described in detail with reference to the drawings. In the present specification, an "etching solution" means a solution for etching an oxide film or metal coating on a substrate, and contains hydrofluoric acid, hydrochloric acid, sulfuric acid, nitric acid and phosphoric acid. A "cleaning solution" means a solution for cleaning a substrate, and includes a polymer removal solution and an etching solution. Further, a "processing solution" includes a cleaning solution, pure water and a photoresist.

1. First Embodiment

<1-1. System Configuration>

Figure 1:
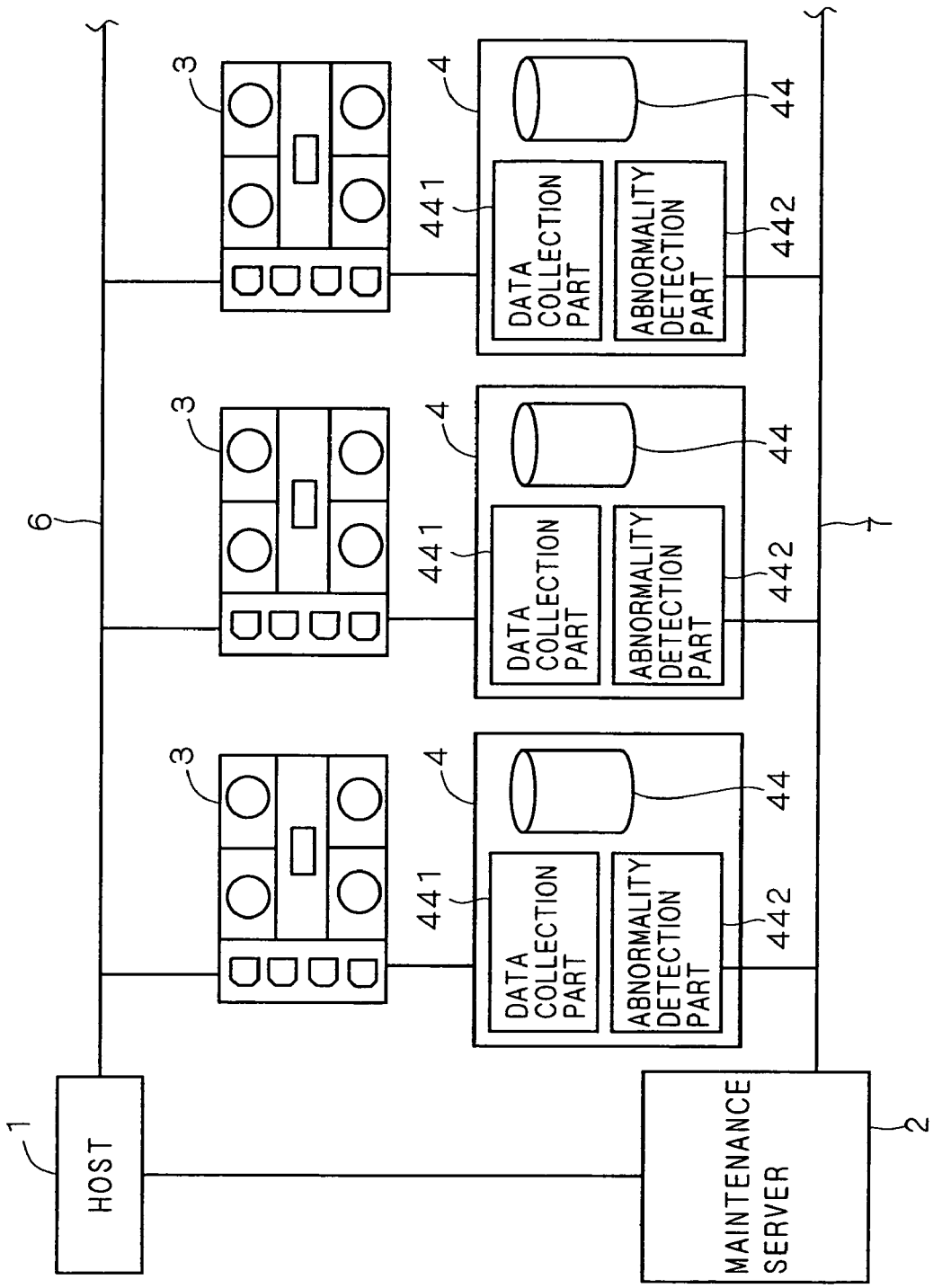
FIG. 1 is an exemplary view of a substrate processing system according to the present invention.

FIG. 1 is an exemplary view of a substrate processing system according to the present invention. The substrate processing system comprises one host computer 1, three substrate processing apparatuses 3 connected to the host computer 1, and a maintenance server 2 connected to the substrate processing apparatuses 3. The substrate processing system of FIG. 1 is located in a semiconductor manufacturing plant, for example. The three substrate processing apparatuses 3 are connected in parallel to the host computer 1 through a production management network 6. The three substrate processing apparatuses 3 are connected in parallel to the maintenance server 2 through a maintenance network 7.

Data collection controllers 4 are interposed in the maintenance network 7 connecting each one of the three substrate processing apparatuses 3 and the maintenance server 2. In the present embodiment, three data collection controllers 4 are connected in one-to-one correspondence to the three substrate processing apparatuses 3. The three data collection controllers 4 are connected to the maintenance server 2. The host computer 1 is connected via a certain circuit to the maintenance server 2.

The present embodiment includes three substrate processing apparatuses 3. Alternatively, one substrate processing apparatus 3 may be provided. Still alternatively, two or more substrate processing apparatuses 3 may be provided. When two or more substrate processing apparatuses 3 are provided, a plurality of data collection controllers 4 are preferably in one-to-one correspondence to the substrate processing apparatuses 3. However, a plurality of substrate processing apparatuses 3 may be connected to one data collection controller 4. The networks and circuits constituting the substrate processing system of FIG. 1 may either have a wired or wireless system.

Figure 2:
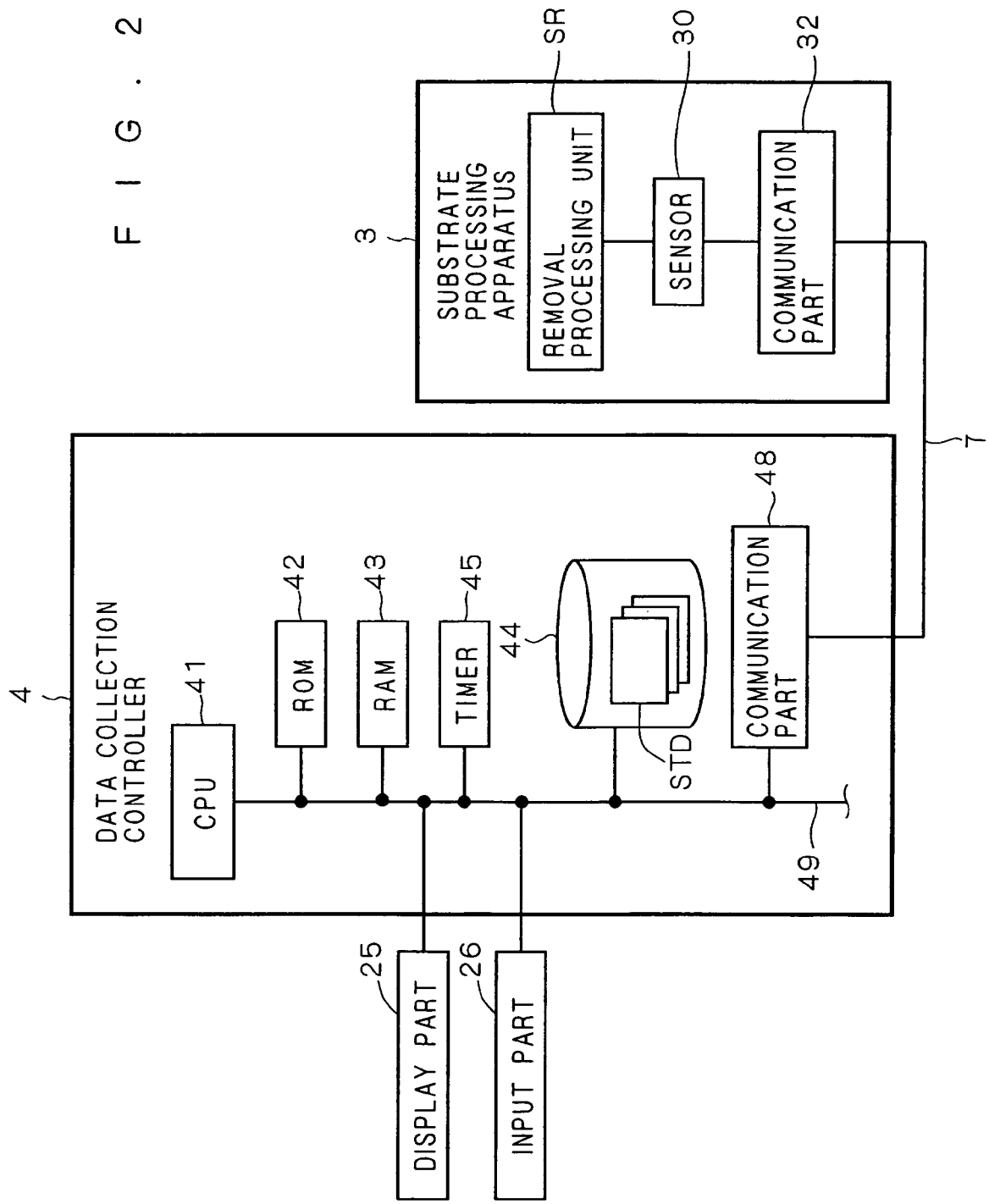
FIG. 2 is a block diagram showing the configuration of a substrate processing system according to a first embodiment.

Next, the constituent elements of this substrate processing system will be discussed in turn. FIG. 2 is a block diagram showing the configuration of the substrate processing system according to the first embodiment.

<1-1-1. Maintenance Server>

The maintenance server 2 serves to perform maintenance and troubleshooting of the substrate processing apparatuses 3 based on various types of data collected from the substrate processing apparatuses 3 by the data collection controllers 4. The maintenance server 2 has the same hardware configuration as that of a commonly used computer. That is, the maintenance server 2 includes a CPU responsible for various types of computations, a ROM as a read-only memory storing basic programs, a RAM as a readable and writable memory storing various types of information, a magnetic disk as a recording medium, and the like. The CPU of the maintenance server 2 executes a certain program stored for example in the magnetic disk, whereby the maintenance server 2 becomes operative to perform a variety of operations such as maintenance of the substrate processing apparatuses 3.

<1-1-2. Host Computer>

Although omitted from FIG. 2 for the convenience of description, the host computer 1 is responsible for production management of the system as a whole. The host computer 1 is responsible for process management and logistics management of the substrate processing apparatuses 3. The host computer 1 also has the same hardware configuration as that of a commonly used computer. More specifically, the host computer 1 includes a CPU responsible for various types of computations, a ROM as a read-only memory storing basic programs, a RAM as a readable and writable memory storing various types of information, a magnetic disk as a recording medium, and the like. The program executed by the host computer 1 is different from that executed by the maintenance server 2. The CPU of the host computer 1 performs computations according to a specific program, whereby the host computer 1 becomes operative to perform a variety of operations such as process management of the substrate processing apparatuses 3.

<1-1-3. Data Collection Controller>

The data collection controllers 4 are each a type of computer serving to collect various types of data from the substrate processing apparatuses 3. The data collection controller 4 also has the same hardware configuration as that of a commonly used computer. That is, the data collection controller 4 has a connection through a bus line 49 including a CPU 41 responsible for various types of computations, a ROM 42 as a read-only memory storing basic programs, and a RAM 43 as a readable and writable memory storing various types of information. A magnetic disk 44 storing for example control software and data, a communication part 48 responsible for communication to and from the substrate processing apparatus 3 and the maintenance server 2 through the maintenance network 7, and a timer 45 having a timing mechanism are also connected to the bus line 49.

A display part 25 responsible for display of various types of information, and an input part 26 receiving input from an operator are further connected to the bus line 49. As an example, the display part 25 may be a liquid crystal or a CRT display. As an example, the input part 26 may include a keyboard and a mouse. Alternatively, a touch panel may be used as an integration of the display part 25 and the input part 26.

The connection through the bus line 49 may include a reader for reading various types of data from a recording medium such as an optical disk, a magnetic disk or a magneto-optical disk. The data collection controller 4 may read a program from a recording medium by way of such a reader and store the same in the magnetic disk 44. Alternatively, a program may be downloaded from another server to be stored in the magnetic disk 44. The CPU 41 performs computations according to the program stored in the magnetic disk 44, whereby the data collection controller 4 becomes operative to perform a variety of operations. That is, as a result of computations by the CPU 41 according to this program, the data collection controller 4 becomes operative to function as the controller 4 for data collection. A data collection part 441 and an abnormality detection part 442 shown in FIG. 1 are processing parts operative in the data collection controller 4 as a result of execution of this program by the CPU 41. The operations of the data collection part 441 and the abnormality detection part 442 will be discussed later.

<1-1-4. Substrate Processing Apparatus>

The substrate processing apparatuses 3 of the first embodiment are polymer removal and cleaning apparatuses for removing polymers from substrates. In a manufacturing process of a semiconductor device, for example, a metal film including aluminum or copper, or an insulating film such as a silicon oxide film or a low dielectric constant interlayer insulating film (low-k film) or the like formed on a substrate, is subjected to dry etching in the vapor phase using a patterned resist film as a mask. Dry etching exhibits excellence in that it provides reliability of etching in a vertical direction even into a fine pattern and thus, is an important process in today's trend toward finer circuit patterns.

However, reactive ions used for example in an RIE (reactive ion etching) apparatus have extremely high power. Thus, at the time when a thin film as a target of etching is sufficiently etched, a resist as a mask is removed by more than half, partially transformed into polymers to be deposited on a substrate. Polymers thus generated are not removed in a following step of removing a resist and thus, should be removed in a cleaning step to be performed prior to or after the step of removing a resist. The substrate processing apparatuses 3 serve to remove polymers as reaction products generated from a resist and a thin film as a result of the foregoing dry etching to clean substrates.

Figure 3:
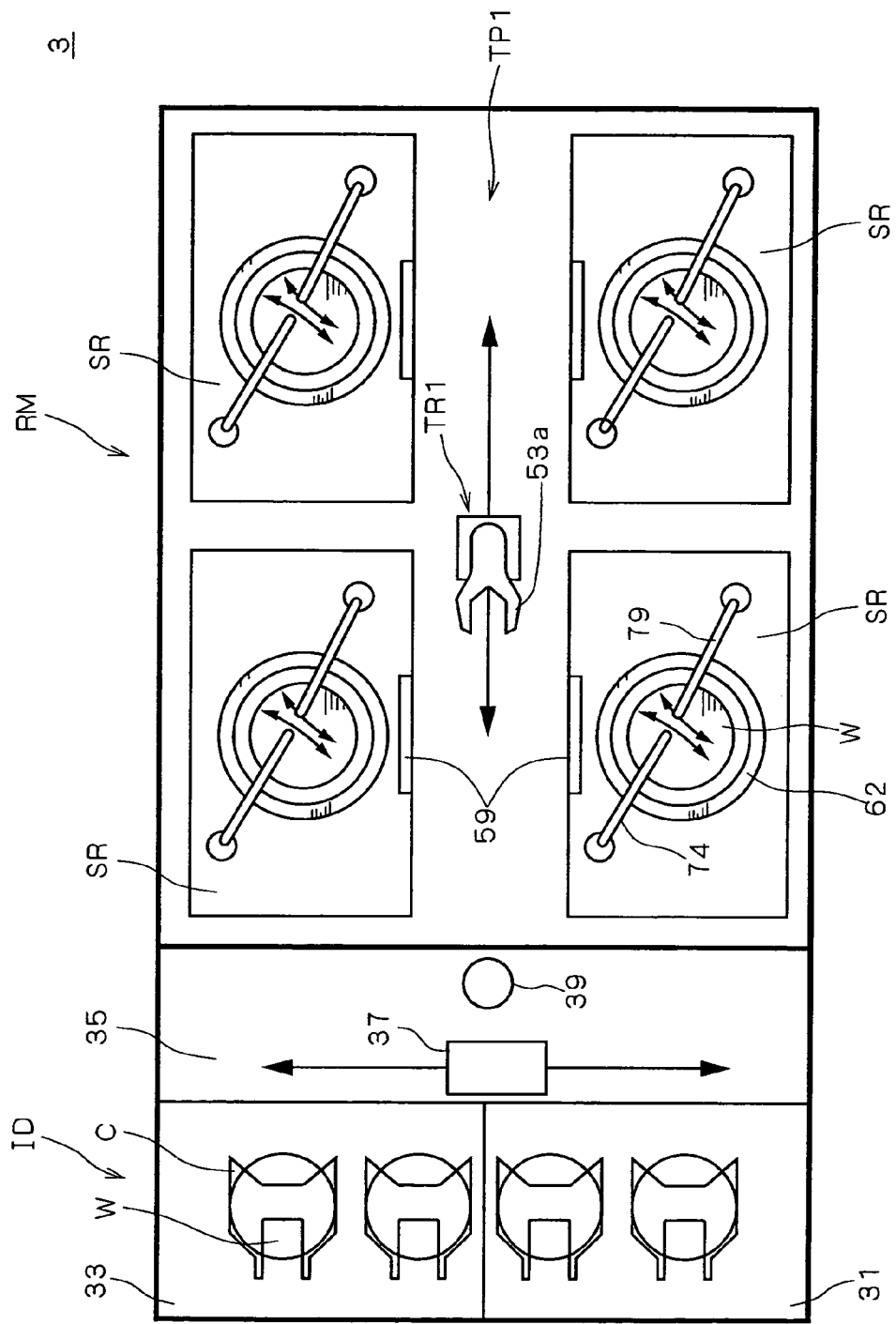
FIG. 3 is a plan view of a substrate processing apparatus in the substrate processing system according to the first embodiment.

FIG. 3 is a plan view of the substrate processing apparatus 3. The substrate processing apparatus 3 comprises an inward and outward transport part ID and a removal processor RM arranged in juxtaposition. The three substrate processing apparatuses 3 shown in FIG. 3 all have the same configuration.

The inward and outward transport part ID comprises an inward transport section 31 holding carriers (cassettes) C each storing a plurality of unprocessed substrates W, an outward transport section 33 holding carriers C each storing a plurality of processed substrates W, and a transfer section 35.

The inward transport section 31 has a holding base in the form of a table. By means of a transport mechanism such as an AGV (automatic guided vehicle) provided outside the apparatus, two carriers C are transported in the inward transport section 31 to be placed on this holding base. The carriers C each hold vertically stacked substrates W (25 substrates W, for example) spaced from each other in a horizontal position. The outward transport section 33 also has a holding base in the form of a table which holds two carriers C. These two carriers are transported out by means of a transport mechanism provided outside the apparatus.

The transfer section 35 has an inward and outward transport mechanism 37 moving in a direction in which the carriers C of the inward and outward transport sections 31 and 33 are aligned while transporting a substrate W to and from the carriers C, and a transfer base 39. The inward and outward transport mechanism 37 includes an inward and outward transport arm not shown. In addition to the movement in a horizontal direction, the inward and outward transport mechanism 37 is capable of rotating about an axis extending in a vertical direction, moving up and down in a vertical direction, and causing the inward and outward transport arm to move back and forth, whereby the inward and outward transport mechanism 37 transports a substrate W to and from the carriers C, and transfers and receives a substrate W to and from the transfer base 39.

The removal processor RM adjacent to the inward and outward transport part ID comprises four single-substrate type removal processing units SR each storing a substrate W to perform removal of reaction products such as polymers, and a transport robot TRI for transferring a substrate W to and from the transfer base 39 and transferring a substrate W to and from the four removal processing units SR.

Two of the removal processing units SR arranged in a direction perpendicular to the direction in which the carriers C of the inward and outward transport part ID are aligned form a row of removal processing units SR. Two rows of removal processing units SR spaced apart from each other follow the direction in which the carriers C are aligned. The transport robot TR1 is arranged in a transport path TP1 defined between the these rows of removal processing units SR.

The transport robot TR1 runs in the longitudinal direction of the transport path TP1 (the direction in which the foregoing rows of removal processing units SR are formed) to transfer a substrate W to and from the transfer base 39 while transferring a substrate W to and from each one of the four removal processing units SR.

Figure 4:
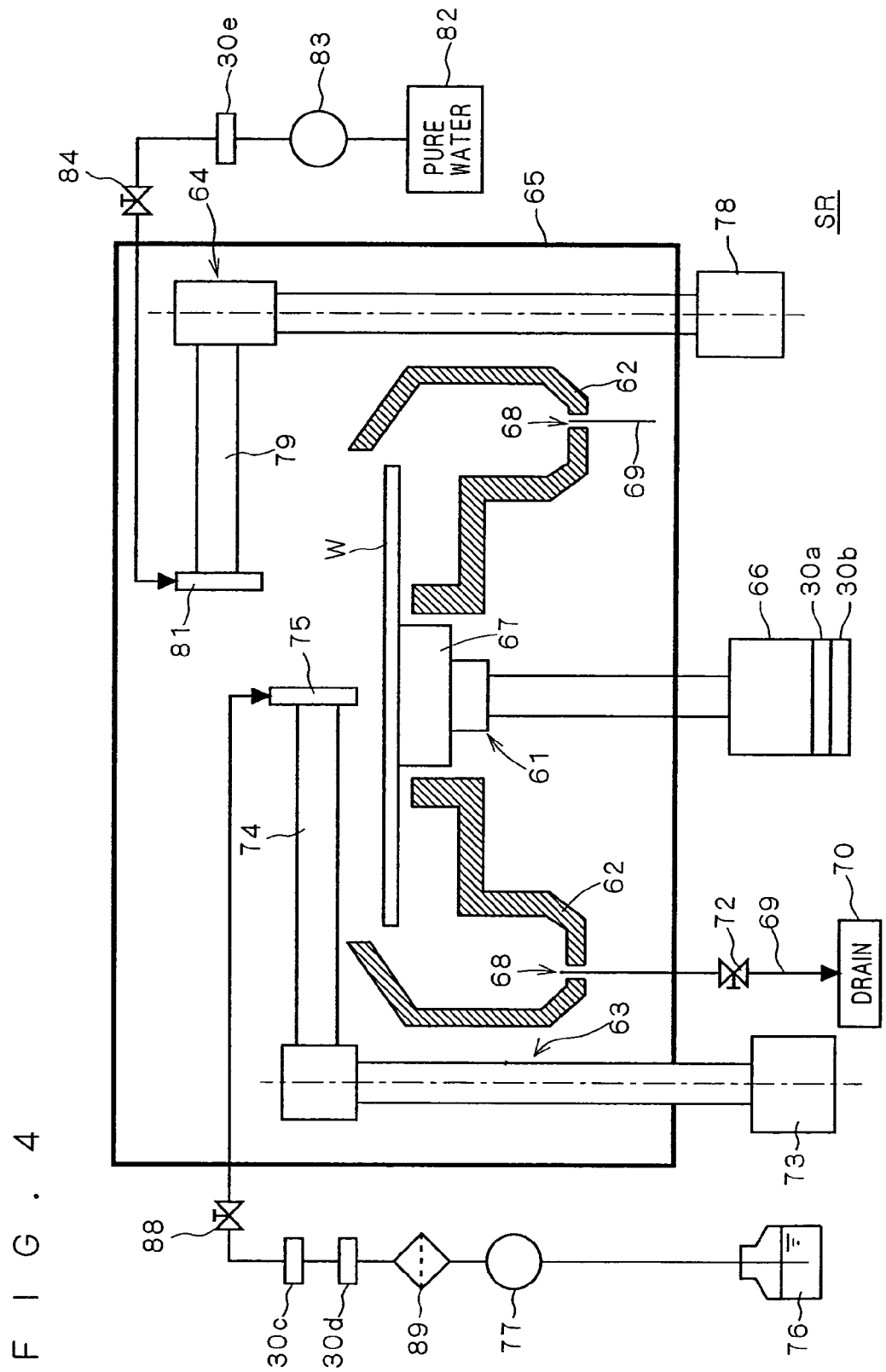
FIG. 4 shows the configuration of a removal processing unit in the substrate processing apparatus of FIG. 3.

FIG. 4 shows the configuration of the removal processing unit SR. The removal processing unit SR has a substrate holding part 61 for rotating one substrate W while holding the same in a horizontal position, a cup 62 surrounding the substrate W held on the substrate holding part 61, a removal solution supply part 63 for supplying a removal solution onto the substrate W held on the substrate holding part 61, a pure water supply part 64 for supplying pure water onto the substrate W held on the substrate holding part 61, and a chamber 65 for storing the substrate W held on the substrate holding part 61.

The chamber 65 is provided with a shutter 59 (see FIG. 3) which is opened by an opening and closing mechanism not shown when a substrate W is transported to and from the chamber 65 by the transport robot TR1, and is otherwise closed. The chamber 65 is constantly under an atmospheric pressure. By means of an exhaust mechanism not shown, atmosphere is exhausted from the chamber 65 to be discharged to an exhaust duct outside the apparatus, thereby preventing leakage of the atmosphere containing a mist or vapor of processing solution from the chamber 65.

The substrate holding part 61 has a motor 66 provided outside the chamber 65, and a chuck 67 rotatably driven by the motor 66 to rotate about an axis extending in a vertical direction. The motor 66 is provided with a motor speed sensor 30a for detecting the rotation speed of the motor 66, and a motor torque sensor 30b for detecting the rotation torque. As an example, the motor speed sensor 30a may be an encoder, and the motor torque sensor 30b may be various kinds of known torque meters.

The chuck 67 is a so-called vacuum chuck capable of holding a substrate W in a substantially horizontal position under vacuum suction. With a substrate W held by the chuck 67, the motor 66 rotates the chuck 67 to rotate the substrate W held by the chuck 67 in a horizontal plane about an axis extending in a vertical direction. The rotation speed and torque of the motor 66 while rotating the substrate W are detected by the motor speed sensor 30a and the motor torque sensor 30b, respectively. The chuck 67 is not limited to a so-called vacuum chuck, but may alternatively be a so-called mechanical chuck for holding a substrate W by mechanically gripping the peripheral edge.

The cup 62 has a substantially toroidal shape in top view, with an opening in the center allowing the chuck 67 to pass therethrough. The cup 62 collects a solution (which may be a removal solution or pure water) scattering from a rotating substrate W and discharges the collected solution through a drain port 68 at the bottom of the cup 62. The drain port 68 is provided with a drain pipe 69 leading to a drain 70. A drain valve 72 is interposed in the drain pipe 69 for opening and closing the line of the drain pipe 69. The cup 62 is caused to move up and down by a mechanism not shown.

The removal solution supply part 63 has a motor 73 provided outside the chamber 65, an arm 74 caused to pivot by the pivotal motion of the motor 73, a removal solution nozzle 75 provided to an end of the arm 74 and serving to downwardly discharge a removal solution, a removal solution supply source 76 which may for example be a bottle storing a removal solution, and a pump 77 for feeding a removal solution from the removal solution supply source 76 toward the removal solution nozzle 75. A conduit is communicatively connected between the removal solution nozzle 75 and the removal solution supply source 76. A removal solution valve 88 and a filter 89 for purifying a removal solution are interposed in this conduit. A flowmeter 30c and a thermometer 30d are further interposed in the conduit to respectively detect the flow rate and the temperature of a removal solution passing through the conduit.

Means not shown for causing up and down movement of the motor 73 is also provided to raise and lower the removal solution nozzle 75. The actuation of the motor 73 causes the removal solution nozzle 75 to reciprocally move between a discharge position above the center of rotation of a substrate W and a standby position outside the cup 62.

The pump 77 is actuated and the removal solution valve 88 is opened to feed a removal solution from the removal solution supply source 76 toward the removal solution nozzle 75, whereby the removal solution is discharged from the removal solution nozzle 75. Here, a removal solution means a polymer removal solution for selectively removing only polymers. As an example, an organic amine-based removal solution containing organic amine such as dimethyl sulfoxide and dimethylformamide, an ammonium fluoride-based removal solution containing ammonium fluoride, or an inorganic-based removal solution may be used. The flow rate and the temperature of a removal solution fed to the removal solution nozzle 75 are detected by the flowmeter 30c and the thermometer 30d, respectively.

The pure water supply part 64 has a motor 78 provided outside the chamber 65, an arm 79 caused to pivot by the pivotal motion of the motor 78, a pure water nozzle 81 provided to an end of the arm 79 and serving to downwardly discharge pure water, a pure water source 82 for supplying pure water to the pure water nozzle 81, and a pump 83 for feeding pure water from the pure water source 82 toward the pure water nozzle 81. A conduit is communicatively connected between the pure water nozzle 81 and the pure water source 82. A pure water valve 84 is interposed in this conduit. A flowmeter 30e is further interposed in this conduit to detect the flow rate of pure water passing through this conduit.

Means not shown for causing up and down movement of the motor 78 is also provided to raise and lower the pure water nozzle 81. The actuation of the motor 78 causes the pure water nozzle 81 to reciprocally move between a discharge position above the center of rotation of a substrate W and a standby position outside the cup 62.

The pump 83 is actuated and the pure water valve 84 is opened to feed pure water from the pure water source 82 toward the pure water nozzle 81, whereby pure water is discharged from the pure water nozzle 81. The flow rate of pure water fed to the pure water nozzle 81 is detected by the flowmeter 30e.

In the removal processing unit SR with the configuration discussed so far, a removal solution is discharged onto a substrate W while rotating the substrate W and thereafter, pure water is discharged to wash away the removal solution. Thus, reaction products such as polymers coating the substrate W can be removed.

In terms of the communication management of the system as a whole, the configuration of the substrate processing apparatus 3 is such that the removal processing unit SR is connected to various types of sensors 30 which are connected through a communication part 32 and the maintenance network 7 to the data collection controller 4 as shown in FIG. 2. Here, the motor speed sensor 30a, motor torque sensor 30b, flowmeter 30c, thermometer 30d and flowmeter 30e are collectively called "sensors 30", and will be referred to simply as a sensor 30 when distinction therebetween is not required.

With the configuration shown in FIG. 2, the sensor 30 detects for example the rotation speed of the motor 66 and sends the result to the data collection controller 4, the detail of which will be discussed later.

<1-2. Substance of Processing>

Figure 5:
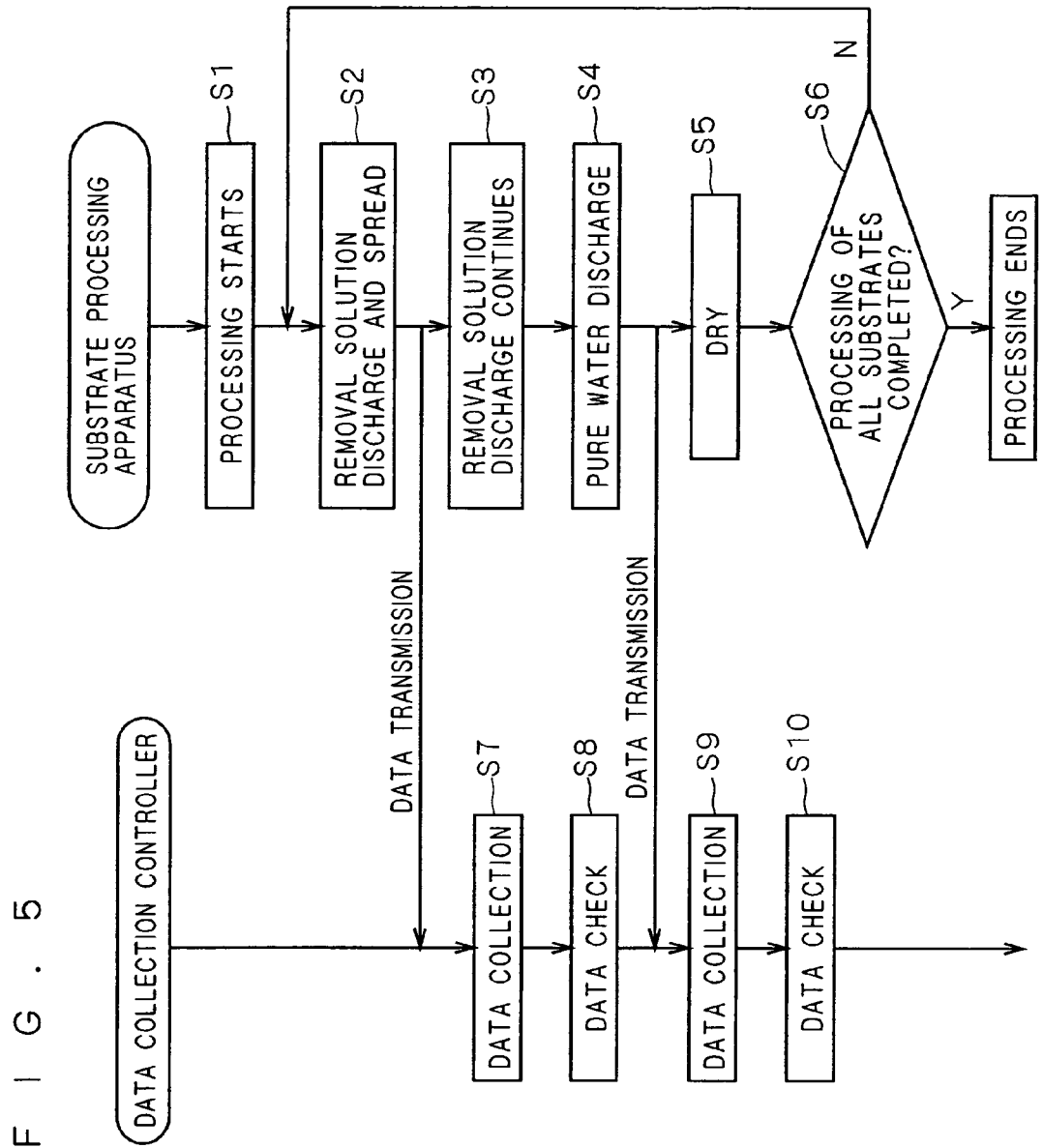
FIG. 5 shows an exemplary process sequence in the substrate processing system according to the first embodiment.
Figure 6:
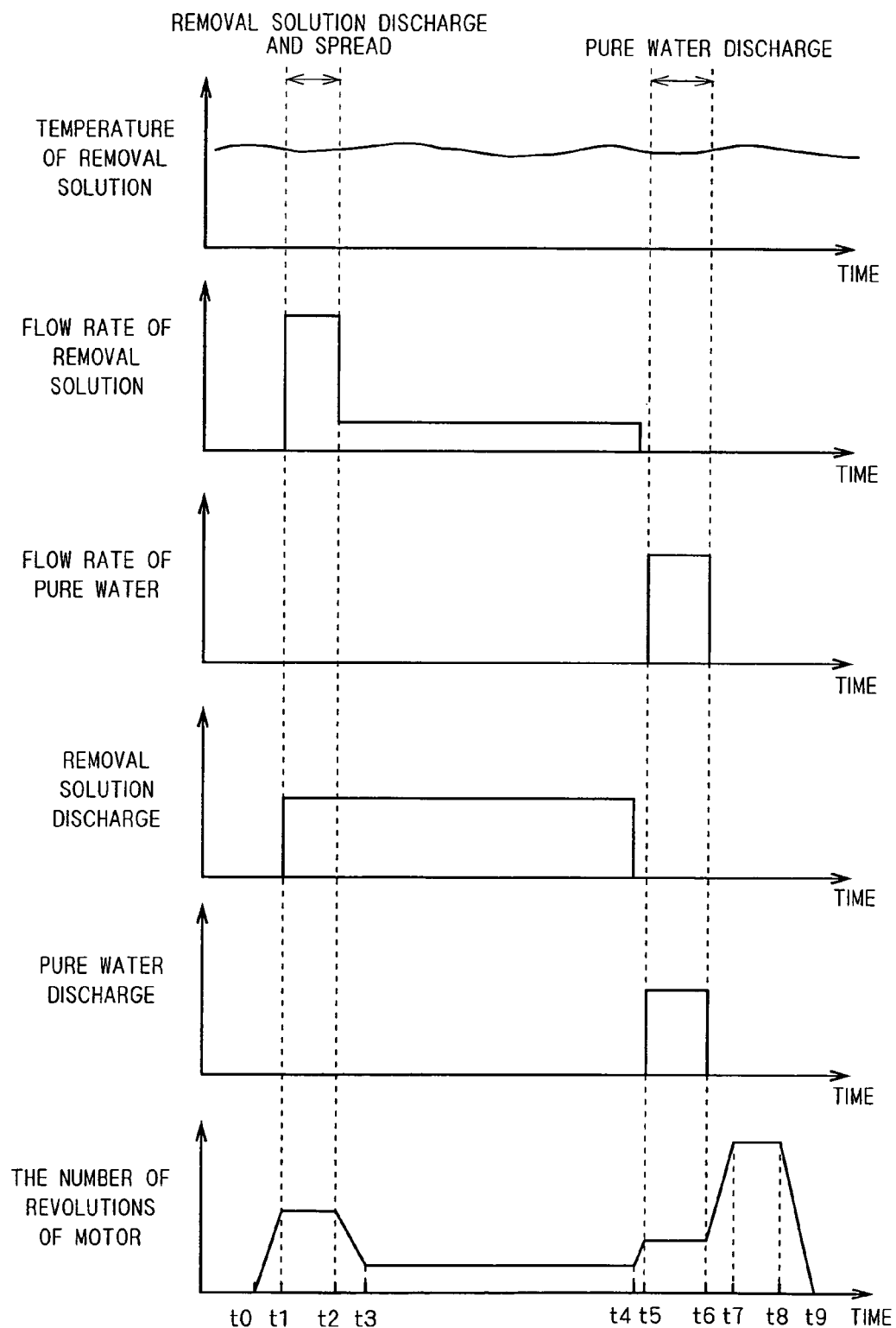
FIG. 6 is a timing chart showing the operation in the substrate processing apparatus of FIG. 3.

Next, the substance of processing in the substrate processing system with the foregoing configuration will be discussed. FIG. 5 shows an exemplary process sequence in the substrate processing system according to the first embodiment. FIG. 6 is a timing chart showing the operation in the substrate processing apparatus 3.

First, in response to an instruction from the host computer 1, substrate processing is started in the substrate processing apparatus 3 (step S1). The substrate processing in the first embodiment is polymer removal. In addition to the instruction to start processing, the host computer 1 also gives a flow recipe describing the processing sequence and conditions to the substrate processing apparatus 3.

The substance of processing in the substrate processing apparatus 3 is schematically discussed below that substantially comprises a removal solution discharge step, a pure water discharge step and a dry step. The removal solution discharge step includes a step of first discharging and spreading a removal solution to coat a substrate W, and a subsequent step of continuing discharge of the removal solution.

First, unprocessed substrates W (after being subjected to dry etching in many cases) stored in the carrier C are transported in the inward transport section 31 by means of an AGV, for example. These substrates W have been subjected to dry etching using a patterned resist film as a mask, and coated with polymers as reaction products generated from the resist film and an insulating film.

One of the substrates W is taken out from the carrier C of the inward transport section 31 by the inward and outward transport mechanism 37 to be placed on the transfer base 39. The substrate W placed on the transfer base 39 is transferred to the transport robot TR1 and carried into one of the four removal processing units SR. In the removal processing unit SR, the shutter 59 is opened and the substrate W carried by the transport robot TR1 is received and held on the chuck 67. Thereafter the shutter 59 is closed, the cup 62 is moved up to a position to surround the substrate W held on the chuck 67, and the drain valve 72 is opened.

Next, the motor 66 starts to rotate at time to indicated in FIG. 6 to rotate the substrate W. When the number of revolutions of the substrate W reaches a predetermined number, the removal solution discharge and spread step (step S2) is started at time t1. In step S2, a removal solution is discharged and spread to coat the substrate W while rotating the substrate W at a relatively high speed. In the removal solution discharge and spread step, the motor 73 causes the removal solution nozzle 75 to pivotally move from a standby position to a discharge position. Then the pump 77 is actuated and the removal solution valve 88 is opened to cause discharge of a removal solution from the removal solution nozzle 75 onto the substrate W. The removal solution supplied to the surface of the substrate W is spread by centrifugal force to coat the surface in its entirety, going down to the outside of the substrate W to be collected by the cup 62, thereafter entering the drain 70 through the drain pipe 69.

In the removal solution discharge and spread step (step S2), the data collection controller 4 monitors and collects a plurality of control elements. Here, "control elements" mean controllable elements exerting influence on the results of processing. In step S2, the control elements include the number of revolutions of a substrate W (namely, the number of revolutions of the motor 66), the flow rate and the temperature of a removal solution fed toward the removal solution nozzle 75, removal solution discharge time from the start of discharge, and the like.

After removal solution discharge and spread is started on a target substrate W in the substrate processing apparatus 3 in step S2 shown in FIG. 5, transmission of data indicative of the control elements about this substrate W is started from the substrate processing apparatus 3 to the data collection controller 4. As a specific example, when the substrate W is subjected to the removal solution discharge and spread step, the motor speed sensor 30a detects the rotation speed of the motor 66 at certain intervals previously set. The data indicative of the result of detection is constantly sent through the maintenance network 7 to the data collection controller 4.

This completely applies to the control elements except the removal solution discharge time. During the removal solution discharge and spread step, the motor torque sensor 30b, the flowmeter 30c and the thermometer 30d respectively detect at certain intervals the torque of the motor 66, and the flow rate and the temperature of a removal solution fed toward the removal solution nozzle 75. The data indicative of the results of detection is constantly sent through the maintenance network 7 to the data collection controller 4. Detection of the control elements at shorter intervals results in more detailed control elements responsive to changes over time, which in turn causes an increased volume of data to be handled to result in a heavier burden on communications. Thus, these intervals may be determined in consideration of a balance therebetween.

Regarding collection of the removal solution discharge time, the timer 45 measures a time interval during which the removal solution valve 88 continues to be opened after discharge of the removal solution is started. The start of removal solution discharge is timed to coincide with detection of a signal indicating opening of the removal solution valve 88, or detection of a predetermined flow rate or more of a removal solution by the flowmeter 30c. A signal indicating whether or not the removal solution valve 88 is open is also sent through the maintenance network 7 to the data collection controller 4.

The data collection part 441 of the data collection controller 4 (see FIG. 1) thus collects data indicating each control element during the removal solution discharge and spread step (step S7). Based on the collected data of each control element, the abnormality detection part 442 detects a processing abnormality in the substrate processing apparatus 3 (step S8). More specifically, a reference data file STD containing reference values of the control elements obtained in successful polymer removal is previously stored in the magnetic disk 44. The CPU 41 of the data collection controller 4 compares the data of the control elements collected in step S7 and the reference data file STD to detect a processing abnormality.

For detection of a processing abnormality, the abnormality detection part 442 synthetically assesses a combination of a plurality of control elements in the removal solution discharge and spread step which more particularly include the number of revolutions of a substrate, the temperature and flow rate of a removal solution and the removal solution discharge time, and does not assess each control element independently. As an example, even when removal solution discharge is started behind time t1 to result in shorter removal solution discharge time in the removal solution discharge and spread step than that stored in the reference data file STD, the amount of removal solution supplied to a substrate W is considered to be substantially the same as the reference value in the event that the flow rate of the removal solution in the removal solution discharge and spread step is greater than that stored in the reference data file STD. In such a case, a combination of a plurality of control elements is synthetically assessed to determine no processing abnormality is present. Conversely, even with the control elements each having a value close to a corresponding reference value, it may be determined a processing abnormality is present as a result of compilation of these control elements.

A detected processing abnormality can be handled in various ways. By way of example, the data collection controller 4 may notify the maintenance server 2 or host computer 1 of generation of a processing abnormality. Alternatively, an alarm may be given. Still alternatively, the processing in the substrate processing apparatus 3 may be interrupted according to the substance of a processing abnormality.

When the removal solution discharge and spread step ends at time t2 without detecting a processing abnormality, the number of revolutions of a substrate W is reduced and during an interval between time t3 and time t4, the substrate W is rotated a predetermined number of revolutions. While discharge of a removal solution from the removal solution nozzle 75 continues, the flow rate of discharge during an interval between time t2 and time t4 is lower than that in the foregoing step of removal solution discharge and spread. The process carried out in the interval between time t2 and time t4 is a removal solution discharge continuation step (step S3), which is the step of discharging a removal solution after the removal solution is spread to coat the entire surface of the substrate W. The removal solution supplied to the surface of the substrate W goes down to the outside of the substrate W by centrifugal force to be collected by the cup 62, thereafter entering the drain 70 through the drain pipe 69.

In this removal solution discharge continuation step, the removal solution supplied to the substrate W reacts with polymers deposited on the substrate W, whereby the substrate W is easily stripped of the polymers deposited thereon. Accordingly, polymers are gradually removed from the substrate W by means of reaction with the removal solution and rotation of the substrate W. In step S3 in which removal solution discharge continues, the collection of control elements by the data collection controller 4 is not carried out.

The removal solution discharge continuation step (step S3) ends at time t4, stopping the pump 77, closing the removal solution valve 88 and moving the removal solution nozzle 75 back to a standby position. Further, the number of revolutions of the substrate W is increased again.

When the number of revolutions of the substrate W reaches a predetermined number, a pure water discharge step (step S4) is started at time t5. In step S4, the removal solution remaining on the surface of the substrate W and the polymers stripped off are washed away by pure water. In the pure water discharge step, the motor 78 causes the pure water nozzle 81 to pivotally move from a standby position to a discharge position. Then the pump 83 is actuated and the pure water valve 84 is opened to cause discharge of pure water from the pure water nozzle 81 onto the substrate W. Together with the remaining removal solution and the polymers stripped off, pure water supplied to the surface of the substrate W goes down to the outside of the substrate W by centrifugal force to be collected by the cup 62, thereafter entering the drain 70 through the drain pipe 69.

In the pure water discharge step (step S4), the data collection controller 4 monitors and collects a plurality of control elements. In step S4, the number of revolutions of a substrate W (namely, the number of revolutions of the motor 66), the flow rate of pure water fed toward the pure water nozzle 81, pure water discharge time from the start of pure water discharge and the like are collected as control elements.

With regard to the control elements except the pure water discharge time, after pure water discharge is started in step S4 of FIG. 5 on a certain substrate W in the substrate processing apparatus 3, transmission of data indicative of the control elements about this substrate W is started from the substrate processing apparatus 3 to the data collection controller 4. As a specific example, during the pure water discharge step, the motor speed sensor 30a, the motor torque sensor 30b and the flowmeter 30e respectively detect the rotation speed, torque of the motor 66 and the flow rate of pure water fed toward the pure water nozzle 81 at certain intervals. The data indicative of the results of detection is constantly sent through the maintenance network 7 to the data collection controller 4.

Regarding collection of the pure water discharge time, the timer 45 measures a time interval during which the pure water valve 84 continues to be opened after discharge of pure water is started. The start of pure water discharge is timed to coincide with detection of a signal indicating opening of the pure water valve 84, or detection of a predetermined flow rate or more of pure water by the flowmeter 30e. A signal indicating whether or not the pure water valve 84 is open is also sent through the maintenance network 7 to the data collection controller 4.

The data collection part 441 of the data collection controller 4 (see FIG. 1) thus collects data indicating each control element during the pure water discharge step (step S9). Based on the collected data of each control element, the abnormality detection part 442 detects a processing abnormality in the substrate processing apparatus 3 (step S10). More specifically, like in the foregoing removal solution discharge and spread step, the CPU 41 of the data collection controller 4 compares the reference data file STD containing reference values of the control elements obtained in successful polymer removal and previously stored in the magnetic disk 44, and the data of the control elements collected in step S9, whereby a processing abnormality is detected.

For detection of a processing abnormality, the abnormality detection part 442 synthetically assesses a combination of a plurality of control elements in the pure water discharge step which more particularly include the number of revolutions of a substrate, the flow rate of pure water and the pure water discharge time, and does not assess each control element independently. As an example, even when pure water discharge is started behind time t5 to result in shorter pure water discharge time in the pure water discharge step than that stored in the reference data file STD, the amount of pure water supplied to a substrate W is considered to be substantially the same as the reference value in the event that the flow rate of pure water in the pure water discharge step is greater than that stored in the reference data file STD. In such a case, a combination of a plurality of control elements is synthetically assessed to determine no processing abnormality is present. Conversely, even with the control elements having values close to those stored in the reference data file STD, it may be determined a processing abnormality is present as a result of compilation of these control elements.

As discussed above, a detected processing abnormality can be handled in various ways. When the pure water discharge step (step S4) ends at time t6 without detecting a processing abnormality, the pump 83 is stopped, the pure water valve 84 is closed and the pure water nozzle 81 is moved back to a standby position. The number of revolutions of the substrate W is further increased.

When the number of revolutions of the substrate W reaches a predetermined number, a dry step (step S5) is started at time t7 which is a so-called spin dry step in which the motor 66 rotates the substrate W at a high speed to disperse a solution on the substrate W by powerful centrifugal force. The substrate W is thereby rotatably dried and a series of polymer removal processes is completed. In the dry step (step S5), the collection of control elements by the data collection controller 4 is not carried out. The number of revolutions of a substrate W is smallest in the removal solution discharge continuation step (step S3), increasing in the pure water discharge step (step S4), in the removal solution discharge and spread step (step S2) and in the dry step (step S5) in this order.

The dry step (step S5) ends at time t8 and the number of revolutions of the substrate W is reduced. Thereafter at time t9, the motor 66 stops, the cup 62 moves down from a position around the substrate W, and the shutter 59 is opened. Then the transport robot TR1 takes the substrate W after being subjected to polymer removal out of the removal processing unit SR, and transfers the same onto the transfer base 39 in the inward and outward transport part ID. The substrate W placed on the transfer base 39 is taken out by the inward and outward transport mechanism 37 to be carried into the carrier C held on the outward transport section 33.

If polymer removal of all the substrates W stored in the carrier C transported to the inward transport section 31 is not completed, the process flow returns from step S6 to step S2 to restart polymer removal on another substrate W stored in this carrier C. All the substrates W stored in the carrier C transported to the inward transport section 31 are thereby subjected to the same polymer removal and data check of control elements as discussed.

Following the process flow described so far, a processing abnormality is synthetically detected based on a plurality of control elements, and control elements in polymer removal are not assessed independently. This avoids undesirables occurring in cases where processing giving rise to no problem as a whole even with control elements each deviating from a reference value is detected as a processing abnormality, or conversely, processing containing an abnormality as a whole is not detected as an abnormality. Thus a processing abnormality can be detected with a higher degree of accuracy. That is, what is important is to assess various factors in its entirety to accurately judge the presence or absence of a processing abnormality. According to the present embodiment in which a processing abnormality is detected based on a combination of a plurality of control elements, a processing abnormality can be detected with a high degree of accuracy.

As a specific example of synthetic judgment based on a combination of a plurality of control elements in the first embodiment, even when the removal solution discharge time in the removal solution discharge and spread step is shorter than a reference value, the amount of removal solution supplied to a substrate W is considered to be substantially the same as a reference value in the event that the flow rate of the removal solution is greater than a reference value. In this case, it is judged that no processing abnormality is present. Thus, in a combination of a plurality of control elements deviating from respective reference values by predetermined amounts or more, it is judged that no processing abnormality is present as long as effects caused by such deviation compensate each other. As a result, a processing abnormality can be detected with a high degree of accuracy.

Further, target substrates W are each subjected to constant monitoring and the collection of a plurality of control elements. Thus, in contrast to a conventional example which waits for inspection by a separate inspection unit, a processing abnormality can be detected without any delay.

In a cleaning process such as polymer removal, of a series of foregoing process steps, the step of discharging and spreading a removal solution to coat a rotating substrate W (step S2) and the step of discharging pure water (step S4) are the important steps exerting influence on the results of processing. After concentrated research, the present inventors found that the number of revolutions of a substrate, the temperature and flow rate of a removal solution and removal solution discharge time are the control elements largely exerting influence on the results of processing in the removal solution discharge and spread step, and that the number of revolutions of a substrate, the flow rate of pure water and pure water discharge time are the control elements largely exerting influence on the results of processing in the pure water discharge step.

In response, in the present embodiment, a combination of the number of revolutions of a substrate, the temperature and flow rate of a removal solution and removal solution discharge time is synthetically assessed to detect a processing abnormality in the removal solution discharge and spread step. In the pure water discharge step, a combination of the number of revolutions of a substrate, the flow rate of pure water and pure water discharge time is synthetically assessed to detect a processing abnormality. Thus, a processing abnormality in polymer removal is detected based on a combination of important control elements in important steps largely exerting influence on the results of processing, thereby allowing detection of a processing abnormality with a higher degree of accuracy.

In the removal solution discharge and spread step, the number of revolutions of a substrate, the temperature and flow rate of a removal solution and removal solution discharge time are all desirably assessed as control elements to synthetically detect a processing abnormality as in the present embodiment. Alternatively, at least two or more of these control elements may be monitored to detect an abnormality, in which case a processing abnormality can be detected more accurately as compared to a conventional way.

Similarly, in the pure water discharge step, the number of revolutions of a substrate, the flow rate of pure water and pure water discharge time are all desirably assessed as control elements to synthetically detect a processing abnormality as in the first embodiment. Alternatively, at least two or more of these control elements may be monitored to detect an abnormality, in which case a processing abnormality can be detected more accurately as compared to a conventional way.

2. Second Embodiment>

Next, a second embodiment of the present invention will be described.

<2-1. System Configuration>

A substrate processing system of the second embodiment has a configuration principally the same as that of the first embodiment (see FIG. 1), except that the second embodiment comprises substrate processing apparatuses 3A responsible for wet etching of a substrate surface using an etching solution in place of the substrate processing apparatuses 3 for polymer removal. The other constituents in the substrate processing system of the second embodiment including the host computer 1, maintenance server 2 and data collection controllers 4, and network connections therebetween are the same as those in the first embodiment and thus, will not be described.

Figure 7:
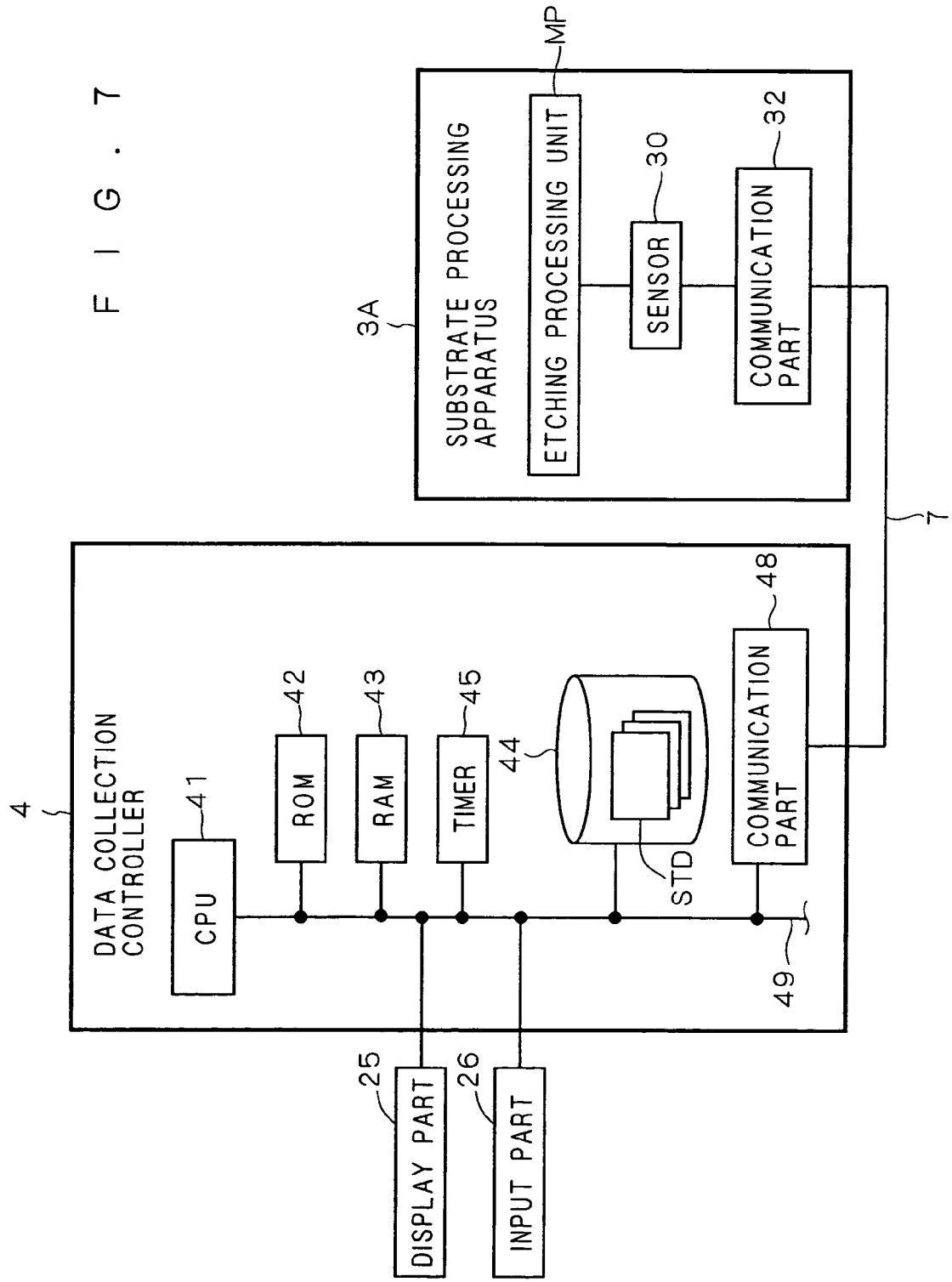
FIG. 7 is a block diagram showing the configuration of a substrate processing system according to a second embodiment.

FIG. 7 is a block diagram showing the configuration of the substrate processing system according to the second embodiment. From FIG. 7 onward, the same constituent elements as those in the first embodiment are designated by the same reference numerals. The substrate processing apparatuses 3A of the second embodiment serve to clean a substrate by means of slice etching of a substrate surface using an etching solution, or etching to remove metal contaminants attached to the substrate surface.

Figure 8:
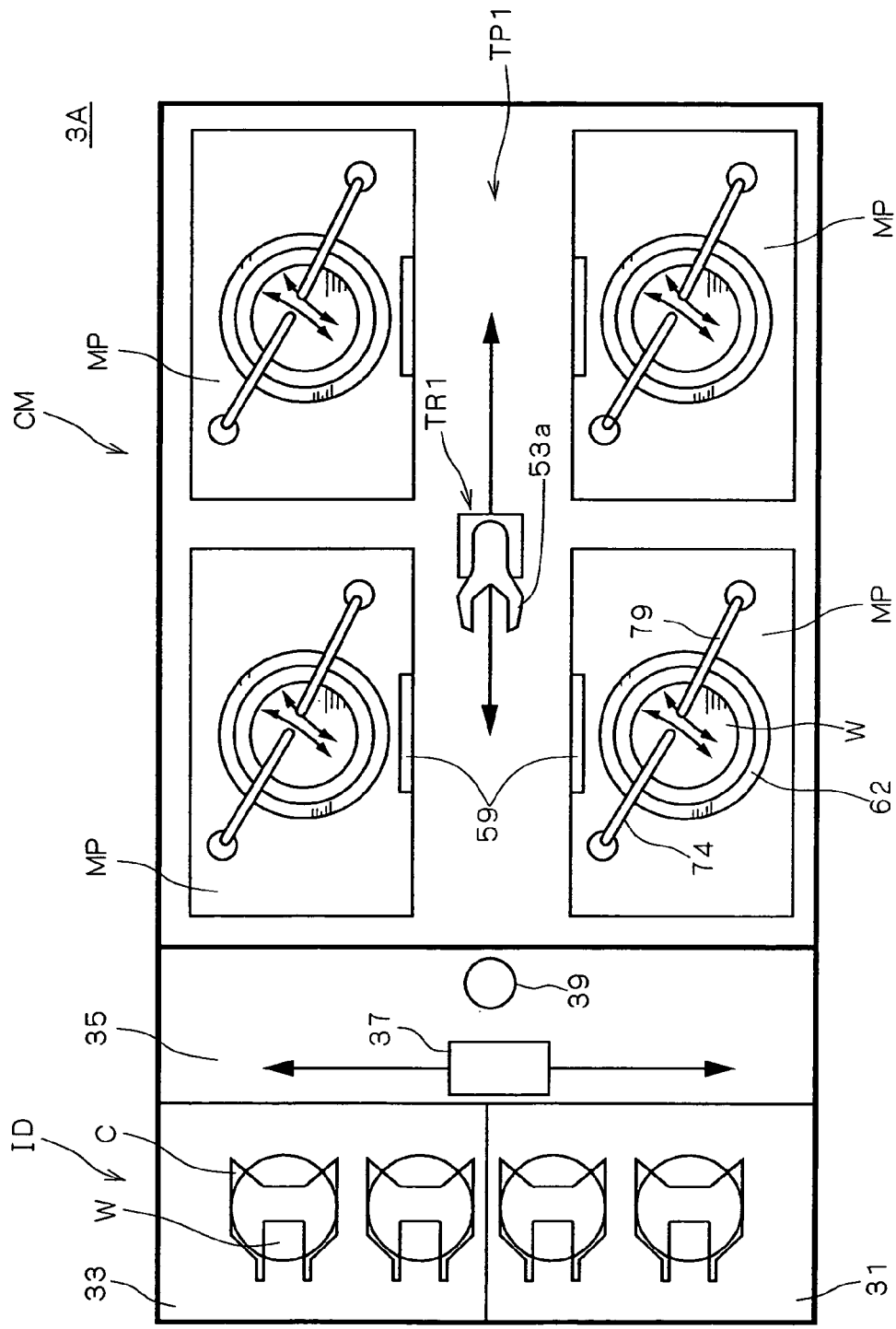
FIG. 8 is a plan view of a substrate processing apparatus in the substrate processing system according to the second embodiment.

FIG. 8 is a plan view of the substrate processing apparatus 3A. The substrate processing apparatus 3A comprises the inward and outward transport part ID and an etching processor CM arranged in juxtaposition. The inward and outward transport part ID has the same configuration as that in the substrate processing apparatus 3 of the first embodiment and hence, is designated by the same reference numeral and will not be discussed in detail.

The etching processor CM adjacent to the inward and outward transport part ID comprises four single-substrate type etching processing units MP each storing a substrate W to perform etching on the surface of the substrate W, and the transport robot TR1 for transferring a substrate W to and from the transfer base 39 and transferring a substrate W to and from the four etching processing units MP.

Two of the etching processing units MP arranged in a direction perpendicular to the direction in which the carriers C of the inward and outward transport part ID are aligned form a row of etching processing units MP. Two rows of etching processing units MP spaced apart from each other follow the direction in which the carriers C are aligned. The transport robot TR1 is arranged in the transport path TP1 defined between these rows of etching processing units MP.

The transport robot TR1 runs in the longitudinal direction of the transport path TP1 (the direction in which the foregoing rows of etching processing units MP are formed) to transfer a substrate W to and from the transfer base 39 while transferring a substrate W to and from each one of the four etching processing units MP.

Figure 9:
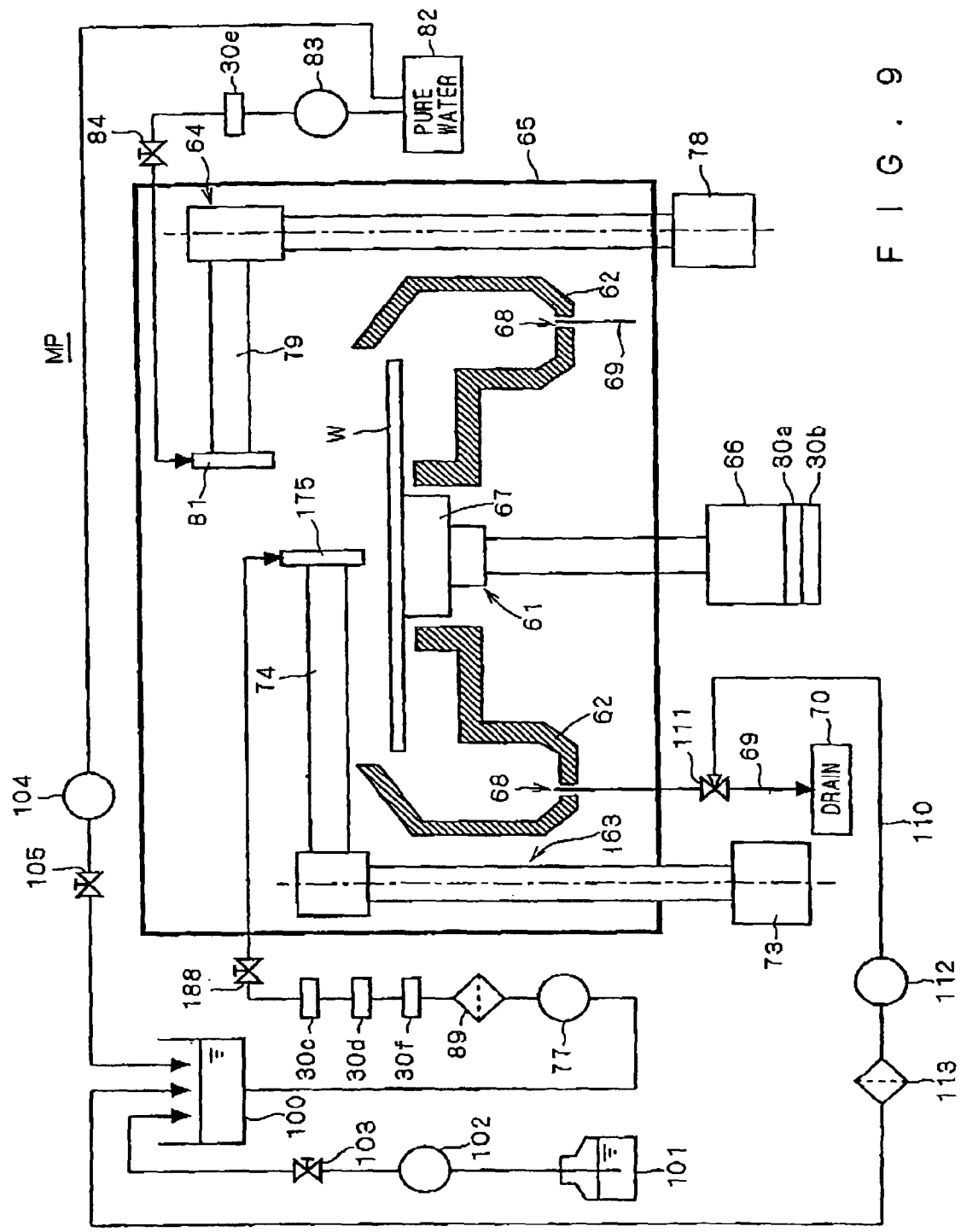
FIG. 9 shows the configuration of an etching processing unit in the substrate processing apparatus of FIG. 8.

FIG. 9 shows the configuration of the etching processing unit MP. The etching processing units MP has the substrate holding part 61 for rotating one substrate W while holding the same in a horizontal position, the cup 62 surrounding the substrate W held on the substrate holding part 61, an etching solution supply part 163 for supplying an etching solution such as hydrofluoric acid, hydrochloric acid or sulfuric acid onto the substrate W held on the substrate holding part 61, the pure water supply part 64 for supplying pure water onto the substrate W held on the substrate holding part 61, and a chamber 65 for storing the substrate W held on the substrate holding part 61.

The chamber 65 is provided with the shutter 59 (see FIG. 8) which is opened by an opening and closing mechanism not shown when a substrate W is transported to and from the chamber 65 by the transport robot TR1, and is otherwise closed. The chamber 65 is constantly under an atmospheric pressure. By means of an exhaust mechanism not shown, atmosphere is exhausted from the chamber 65 to be discharged to an exhaust duct outside the apparatus, thereby preventing leakage of the atmosphere containing a mist or vapor of etching solution from the chamber 65.

The substrate holding part 61 has the motor 66 provided outside the chamber 65, and the chuck 67 rotatably driven by the motor 66 to rotate about an axis extending in a vertical direction. The motor 66 is provided with the motor speed sensor 30a for detecting the rotation speed of the motor 66, and the motor torque sensor 30b for detecting the rotation torque. As an example, the motor speed sensor 30a may be an encoder, and the motor torque sensor 30b may be various kinds of known torque meters.

The chuck 67 is a so-called vacuum chuck capable of holding a substrate W in a substantially horizontal position under vacuum suction. With a substrate W held by the chuck 67, the motor 66 rotates the chuck 67 to rotate the substrate W held by the chuck 67 in a horizontal plane about an axis extending in a vertical direction. The rotation speed and torque of the motor 66 while rotating the substrate W are detected by the motor speed sensor 30a and the motor torque sensor 30b, respectively. The chuck 67 is not limited to a so-called vacuum chuck, but may alternatively be a so-called mechanical chuck for holding a substrate W by mechanically gripping the peripheral edge.

The cup 62 has a substantially toroidal shape in top view, and has an opening in the center allowing the chuck 67 to pass therethrough. The cup 62 collects a solution (which may be an etching solution or pure water) scattering from a rotating substrate W and discharges the collected solution through the drain port 68 at the bottom of the cup 62. The drain pipe 69 is communicatively connected to the drain port 68. A three-way valve 111 is interposed in the drain pipe 69 for switching the line of the drain pipe 69 between a "disposal state" in which the drain port 68 and the drain 70 communicate with each other, and a "circulation state" in which the drain port 68 and a recycle pipe 110 to be discussed later communicate with each other. The cup 62 is caused to move up and down by a mechanism not shown.

The etching solution supply part 163 has the motor 73 provided outside the chamber 65, the arm 74 caused to pivot by the pivotal motion of the motor 73, and etching solution nozzle 175 provided to an end of the arm 74 and serving to downwardly discharge an etching solution, a weighing bath 100 for preparing and storing an etching solution of a prescribed concentration, and the pump 77 for feeding an etching solution from the weighing bath 100 toward the etching solution nozzle 175. A conduit is communicatively connected between the etching solution nozzle 175 and the weighing bath 100. An etching solution valve 188 and a filter 89 for purifying an etching solution are interposed in this conduit. The flowmeter 30c, the thermometer 30d and a concentration meter 30f are further imposed in the conduit to respectively detect the flow rate, the temperature and the concentration of an etching solution passing through the conduit.

The weighing bath 100 is so configured to receive an undiluted etching solution supplied from an undiluted solution supply source 101 and pure water supplied from the pure water source 82. That is, a conduit for supply of an undiluted solution is communicatively connected between the weighing bath 100 and the undiluted solution supply source 101. An undiluted solution supply valve 103 and an undiluted solution feed pump 102 for feeding an undiluted solution are interposed in this conduit. A conduit for supply of pure water is communicatively connected between the weighing bath 100 and the pure water source 82. A weighing-bath-specific pure water feed pump 104 and a weighing-bath-specific pure water supply valve 105 are interposed in this conduit to feed pure water from the pure water source 82 toward the weighing bath 100.

An etching solution captured by the cup 62 is collected to be supplied to the weighing bath 100. That is, the recycle pipe 110 is communicatively connected between the weighing bath 100 and the foregoing three-way valve 111. A circulating pump 112 and a filter 113 for purifying the collected etching solution are interposed in the recycle pipe 110. The three-way valve 111 is placed in a circulation state and the circulating pump 112 is actuated, whereby a spent etching solution discharged from the drain port 68 is purified by the filter 113, thereafter returning to the weighing bath 100.

Means not shown for causing up and down movement of the motor 73 is also provided to raise and lower the etching solution nozzle 175. The actuation of the motor 73 causes the etching solution nozzle 175 to reciprocally move between a discharge position above the center of rotation of a substrate W and a standby position outside the cup 62.

The pump 77 is actuated and the etching solution valve 188 is opened to feed an etching solution from the weighing bath 100 toward the etching solution nozzle 175, whereby the etching solution is discharged from the etching solution nozzle 175. Here, as an etching solution, hydrofluoric acid is used to remove a native oxide film formed on a substrate surface. When metal contaminants attached to a substrate surface is to be removed, hydrochloric acid is used. The flow rate, the temperature and the concentration of an etching solution fed to the etching solution nozzle 175 are detected by the flowmeter 30c, the thermometer 30d and the concentration meter 30f, respectively.

The pure water supply part 64 has a configuration exactly the same as that of the first embodiment and hence, will not be discussed in detail. The pump 83 is actuated and the pure water valve 84 is opened to feed pure water from the pure water source 82 toward the pure water nozzle 81, whereby pure water is discharged from the pure water nozzle 81. The flow rate of pure water fed to the pure water nozzle 81 is detected by the flowmeter 30e.

In the etching processing unit MP with the configuration discussed so far, an etching solution is discharged onto a substrate W for etching a native oxide film or metal contaminants while rotating the substrate W and thereafter, pure water is discharged to wash away the etching solution, thereby cleaning the substrate W.

In terms of the communication management of the system as a whole, the configuration of the substrate processing apparatus 3A is such that the etching processing unit MP is connected to various types of sensors 30 which are connected through the communication part 32 and the maintenance network 7 to the data collection controller 4 as shown in FIG. 7. Here, the motor speed sensor 30a, motor torque sensor 30b, flowmeter 30c, thermometer 30d, flowmeter 30e and concentration meter 30f are collectively called "sensors 30", and will be referred to simply as a sensor 30 when distinction therebetween is not required.

With the configuration shown in FIG. 7, the sensor 30 detects for example the rotation speed of the motor 66 and sends the result to the data collection controller 4, the detail of which will be discussed later.

<2-2. Substance of Processing>

Figure 10:
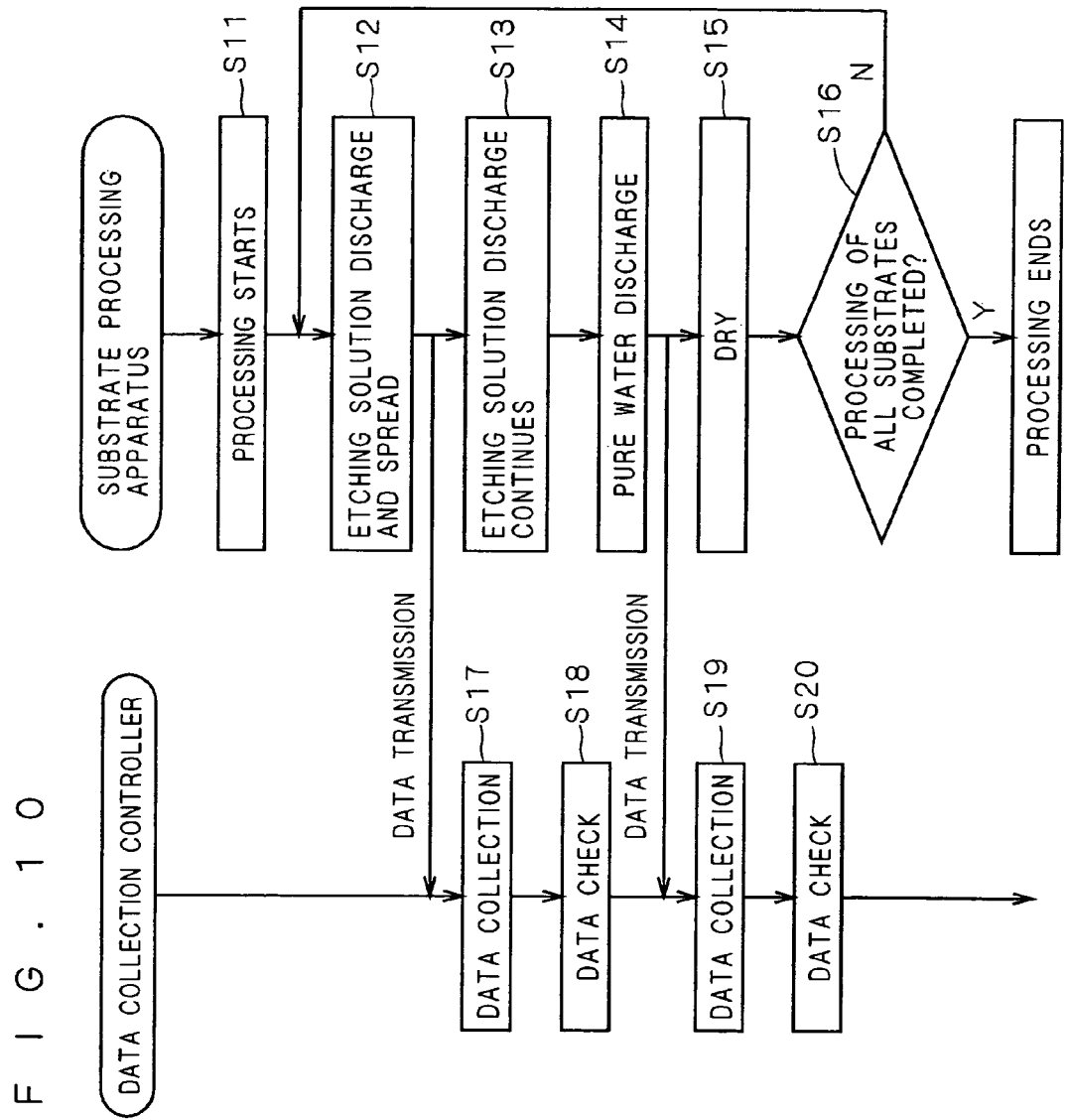
FIG. 10 shows an exemplary process sequence in the substrate processing system according to the second embodiment.
Figure 11:
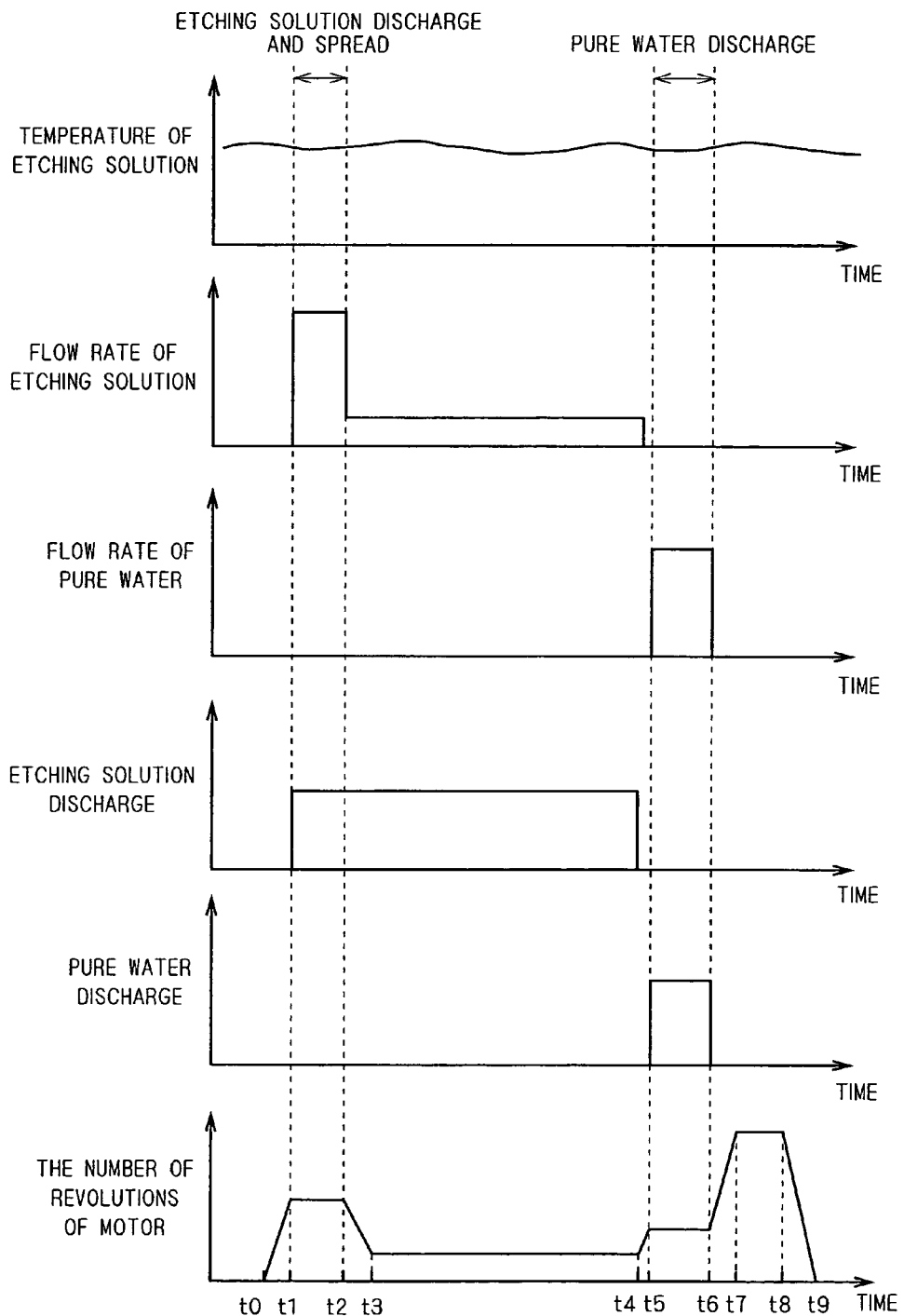
FIG. 11 is a timing chart showing the operation in the substrate processing apparatus of FIG. 8.

Next, the substance of processing in the substrate processing system with the foregoing configuration will be discussed. FIG. 10 shows an exemplary process sequence in the substrate processing system according to the second embodiment. FIG. 11 is a timing chart showing the operation in the substrate processing apparatus 3A.

First, in response to an instruction from the host computer 1, substrate processing is started in the substrate processing apparatus 3A (step S11). The substrate processing in the second embodiment is etching. In addition to the instruction to start processing, the host computer 1 also gives a flow recipe describing the processing sequence and conditions to the substrate processing apparatus 3A.

The substance of processing in the substrate processing apparatus 3A is schematically discussed below that substantially comprises an etching solution discharge step, a pure water discharge step and a dry step. The etching solution discharge step includes a step of first discharging and spreading an etching solution to coat a substrate W, and a subsequent step of continuing discharge of the etching solution.

First, unprocessed substrates W stored in the carrier C are transported in the inward transport section 31 by means of an AGV, for example. One of the substrates W is taken out from the carrier C of the inward transport section 31 by the inward and outward transport mechanism 37 to be placed on the transfer base 39. The substrate W placed on the transfer base 39 is transferred to the transport robot TR1 and carried into one of the four etching processing units MP. In the etching processing unit MP, the shutter 59 is opened and the substrate W carried by the transport robot TR1 is received and held on the chuck 67. Thereafter the shutter 59 is closed, the cup 62 is moved up to a position to surround the substrate W held on the chuck 67, and the three-way valve 111 is switched to a disposal state to establish communication between the drain port 68 and the drain 70.

Next, the motor 66 starts to rotate at time t0 indicated in FIG. 11 to rotate the substrate W. When the number of revolutions of the substrate W reaches a predetermined number, the etching solution discharge and spread step (step S12) is started at time t1. In step S12, an etching solution is discharged and spread to coat the substrate W while rotating the substrate W at a relatively high speed. In the etching solution discharge and spread step, the motor 73 causes the etching solution nozzle 175 to pivotally move from a standby position to a discharge position. Then the pump 77 is actuated and the etching solution valve 188 is opened to cause discharge of an etching solution from the etching solution nozzle 175 onto the substrate W. The etching solution supplied to the surface of the substrate W is spread by centrifugal force to coat the surface in its entirety, going down to the outside of the substrate W to be collected by the cup 62, thereafter entering the drain 70 through the drain pipe 69.

In the etching solution discharge and spread step (step S12), the data collection controller 4 monitors and collects a plurality of control elements. Here, "control elements" mean controllable elements exerting influence on the results of processing as discussed. In step S12, the control elements include the number of revolutions of a substrate W (namely, the number of revolutions of the motor 66), the flow rate, the temperature and the concentration of an etching solution fed toward the etching solution nozzle 175, etching solution discharge time from the start of discharge, and the like.

After etching solution discharge and spread is started on a target substrate W in the substrate processing apparatus 3A in step S12 shown in FIG. 10, transmission of data indicative of the control elements about this substrate W is started from the substrate processing apparatus 3A to the data collection controller 4. As a specific example, when the substrate W is subjected to the etching solution discharge and spread step, the motor speed sensor 30a detects the rotation speed of the motor 66 at certain intervals previously set. The data indicative of the result of detection is constantly sent through the maintenance network 7 to the data collection controller 4.

This completely applies to the control elements except the etching solution discharge time. During the etching solution discharge and spread step, the motor torque sensor 30b, the flowmeter 30c, the thermometer 30d and the concentration meter 30f respectively detect at certain intervals the torque of the motor 66, and the flow rate, the temperature and the concentration of an etching solution fed toward the etching solution nozzle 175. The data indicative of the results of detection is constantly sent through the maintenance network 7 to the data collection controller 4. Detection of the control elements at shorter intervals results in more detailed control elements responsive to changes over time, which in turn causes an increased volume of data to be handled to result in a heavier burden on communications. Thus, these intervals may be determined in consideration of a balance therebetween.

Regarding collection of the etching solution discharge time, the timer 45 measures a time interval during which the etching solution valve 188 continues to be opened after discharge of the etching solution is started. The start of etching solution discharge is timed to coincide with detection of a signal indicating opening of the etching solution valve 188, or detection of a predetermined flow rate or more of an etching solution by the flowmeter 30c. A signal indicating whether or not the etching solution valve 188 is open is also sent through the maintenance network 7 to the data collection controller 4.

The data collection part 441 of the data collection controller 4 (see FIG. 1) thus collects data indicating each control element during the etching solution discharge and spread step (step S17). Based on the collected data of each control element, the abnormality detection part 442 detects a processing abnormality in the substrate processing apparatus 3A (step S18). More specifically, a reference data file STD containing reference values of the control elements obtained in successful etching is previously stored in the magnetic disk 44. The CPU 41 of the data collection controller 4 compares the data of the control elements collected in step S17 and the reference data file STD to detect a processing abnormality.

For detection of a processing abnormality, the abnormality detection part 442 synthetically assesses a combination of a plurality of control elements in the etching solution discharge and spread step which more particularly include the number of revolutions of a substrate, the temperature, flow rate and concentration of an etching solution and the etching solution discharge time, and does not assess each control element independently. As an example, even when the concentration of an etching solution is lower than that stored in the reference data file STD, the etching solution can provide an effect comparable to a reference value on a substrate surface in the event that the discharge time of an etching solution in the etching solution discharge and spread step is longer than the reference data file STD. It is thus considered cleaning has been successfully carried out. In such a case, a combination of a plurality of control elements including the concentration and discharge time of an etching solution is synthetically assessed to determine no processing abnormality is present. Conversely, even with the control elements each having a value close to a corresponding reference value, it may be determined a processing abnormality is present as a result of compilation of these control elements.

A detected processing abnormality can be handled in various ways. By way of example, the data collection controller 4 may notify the maintenance server 2 or host computer 1 of generation of a processing abnormality. Alternatively, an alarm may be given. Still alternatively, the processing in the substrate processing apparatus 3A may be interrupted according to the substance of a processing abnormality.

When the etching solution discharge and spread step ends at time t2 without detecting a processing abnormality, the number of revolutions of a substrate W is reduced and during an interval between time t3 and time t4, the substrate W is rotated a predetermined number of revolutions. While discharge of an etching solution from the etching solution nozzle 175 continues, the flow rate of discharge during an interval between time t2 and time t4 is lower than that in the foregoing step of etching solution discharge and spread. During the interval between time t2 and time t4, the three-way valve 111 is switched to a circulation state to cause the etching solution discharged from the drain port 68 to be collected by the weighing bath 100. The process carried out in the interval between time t2 and time t4 is an etching solution discharge continuation step (step S13), which is the step of discharging an etching solution after the etching solution is spread to cover the entire surface of the substrate W. The etching solution supplied to the surface of the substrate W goes down to the outside of the substrate W by centrifugal force to be collected by the cup 62, thereafter entering the drain pipe 69. The spent etching solution entering the drain pipe 69 is moved from the three-way valve 111 by the circulating pump 112, returning to the weighing bath 100 through the recycle pipe 100 to be mixed with a new etching solution to be used again in circulation. At this time, the spent etching solution returns to the weighing bath 100 after being subjected to purification at the filter 113.

In this etching solution discharge continuation step, the etching solution supplied to the substrate W reacts with contaminants such as a native oxide film or metal coating on the substrate W, thereby dissolving the contaminants. Accordingly, the contaminants are gradually removed from the substrate W by means of reaction with the etching solution and rotation of the substrate W. In step S13 in which etching solution discharge continues, the collection of control elements by the data collection controller 4 is not carried out.

The etching solution discharge continuation step (step S13) ends at time t4, stopping the pump 77, closing the etching solution valve 188 and moving the etching solution nozzle 175 back to a standby position. The three-way valve 111 is switched again to a disposal state again to establish communication between the drain port 68 and the drain 70. Further, the number of revolutions of the substrate W is increased again.

The interval in which the three-way valve 111 is switched to a circulation state to use a spent etching solution collected by the weighing bath 100 in circulation is not limited to the interval between time t2 and time t4 as discussed. As an example, the three-way valve 111 may be switched to a circulation state in the interval between time t1 and time t2 to start the collection of a spent etching solution in the middle of the etching solution discharge and spread step. However, if the start of collection of an etching solution is timed for a point too close to time t1, water droplets deposited on the cup 62 and the like resulting from pure water discharge onto a substrate W previously processed are mixed into the etching solution in large quantities, whereby the concentration of the etching solution to be collected may be considerably lowered. If such a considerably diluted etching solution returns to the weighing bath 100, the concentration of the entire etching solution stored in the weighing bath 100 will also be lowered, possibly resulting in insufficient etching even with prolonged discharge time of an etching solution onto a substrate W. In response, if the collection of an etching solution is timed to start in the interval between time t1 and time t2, the concentration of an etching solution to be collected should be not less than a predetermined value.

In the etching solution discharge continuation step during the interval between time t2 and time t4, an etching solution is deactivated by the dissolution of an oxide or metal. When a native oxide film or large quantities of metal contaminants are deposited on a substrate W to seriously deactivate the etching solution, the collection of the etching solution may be canceled in the interval between time t2 and time t4. With deep concern for deactivation of an etching solution in the etching solution discharge continuation step during the interval between time t2 and time t4, when reduction in concentration of the etching solution caused by mixture of pure water presents no problem, or when pure water discharge itself is not performed, the collection of the etching solution may be limited in the etching solution discharge and spread step in the interval between time t1 and time t2.

When the number of revolutions of the substrate W reaches a predetermined number, a pure water discharge step (step S14) is started at time t5. In step S14, the etching solution remaining on the surface of the substrate W is washed away by pure water. In the pure water discharge step, the motor 78 causes the pure water nozzle 81 to pivotally move from a standby position to a discharge position. Then the pump 83 is actuated and the pure water valve 84 is opened to cause discharge of pure water from the pure water nozzle 81 onto the substrate W. Together with the remaining etching solution, pure water supplied to the surface of the substrate W goes down to the outside of the substrate W by centrifugal force to be collected by the cup 62, thereafter entering the drain 70 through the drain pipe 69.

In the pure water discharge step (step S14), the data collection controller 4 monitors and collects a plurality of control elements. In step S14, the number of revolutions of a substrate W (namely, the number of revolutions of the motor 66), the flow rate of pure water fed toward the pure water nozzle 81, pure water discharge time from the start of pure water discharge and the like are collected as control elements.

With regard to the control elements except the pure water discharge time, after pure water discharge is started in step S14 of FIG. 10 on a certain substrate W in the substrate processing apparatus 3A, transmission of data indicative of the control elements about this substrate W is started from the substrate processing apparatus 3A to the data collection controller 4. As a specific example, during the pure water discharge step, the motor speed sensor 30a, the motor torque sensor 30b and the flowmeter 30e respectively detect the rotation speed, torque of the motor 66 and the flow rate of pure water fed toward the pure water nozzle 81 at certain intervals. The data indicative of the results of detection is constantly sent through the maintenance network 7 to the data collection controller 4.

Regarding collection of the pure water discharge time, the timer 45 measures a time interval during which the pure water valve 84 continues to be opened after discharge of pure water is started. The start of pure water discharge is timed to coincide with detection of a signal indicating opening of the pure water valve 84, or detection of a predetermined flow rate or more of pure water by the flowmeter 30e. A signal indicating whether or not the pure water valve 84 is open is also sent through the maintenance network 7 to the data collection controller 4.

The data collection part 441 of the data collection controller 4 (see FIG. 1) thus collects data indicating each control element during the pure water discharge step (step S1 9). Based on the collected data of each control element, the abnormality detection part 442 detects a processing abnormality in the substrate processing apparatus 3A (step S20). More specifically, like in the foregoing etching solution discharge and spread step, the CPU 41 of the data collection controller 4 compares the reference data file STD containing reference values of the control elements obtained in successful etching and previously stored in the magnetic disk 44, and the data of the control elements collected in step S19, whereby a processing abnormality is detected.

For detection of a processing abnormality, the abnormality detection part 442 synthetically assesses a combination of a plurality of control elements in the pure water discharge step which more particularly include the number of revolutions of a substrate, the temperature and the flow rate of pure water and the pure water discharge time, and does not assess each control element independently. As an example, even when pure water discharge is started behind time t5 to result in shorter pure water discharge time in the pure water discharge step than that stored in the reference data file STD, the amount of pure water supplied to a substrate W is considered to be substantially the same as the reference value in the event that the flow rate of pure water in the pure water discharge step is greater than that stored in the reference data file STD. In such a case, a combination of a plurality of control elements is synthetically assessed to determine no processing abnormality is present. Conversely, even with the control element having values close to those stored in the reference data file STD, it may be determined a processing abnormality is present as a result of compilation of these control elements.

As discussed above, a detected processing abnormality can be handled in various ways. When the pure water discharge step (step S14) ends at time t6 without detecting a processing abnormality, the pump 83 is stopped, the pure water valve 84 is closed and the pure water nozzle 81 is moved back to a standby position. The number of revolutions of the substrate W is further increased.

When the number of revolutions of the substrate W reaches a predetermined number, a dry step (step S15) is started at time t7 which is a so-called spin dry step in which the motor 66 rotates the substrate W at a high speed to disperse a solution on the substrate W by powerful centrifugal force. The substrate W is thereby rotatably dried and a series of etching processes is completed. In the dry step (step S15), the collection of control elements by the data collection controller 4 is not carried out. The number of revolutions of a substrate W is smallest in the etching solution discharge continuation step (step S13), increasing in the pure water discharge step (step S14), in the etching solution discharge and spread step (step S12) and in the dry step (step S15) in this order.

The dry step (step S15) ends at time t8 and the number of revolutions of the substrate W is reduced. Thereafter at time t9, the motor 66 stops, the cup 62 moves down from a position around the substrate W, and the shutter 59 is opened. Then the transport robot TR1 takes the substrate W after being subjected to etching out of the etching processing unit MP, and transfers the same onto the transfer base 39 in the inward and outward transport part ID. The substrate W placed on the transfer base 39 is taken out by the inward and outward transport mechanism 37 to be carried into the carrier C held on the outward transport section 33.

If etching of all the substrates W stored in the carrier C transported to the inward transport section 31 is not completed, the process flow returns from step S16 to step S12 to restart etching on another substrate W stored in this carrier C. All the substrates W stored in the carrier C transported to the inward transport section 31 are thereby subjected to the same etching and data check of control elements as discussed.

Following the process flow described so far, a processing abnormality is synthetically detected based on a plurality of control elements, and control elements in etching are not assessed independently. This avoids undesirables occurring in cases where processing giving rise to no problem as a whole even with control elements each deviating from a reference value is detected as a processing abnormality, or conversely, processing containing an abnormality as a whole is not detected as an abnormality. Thus a processing abnormality can be detected with a higher degree of accuracy. That is, what is important is to assess various factors in its entirety to accurately judge the presence or absence of a processing abnormality. According to the present embodiment in which a processing abnormality is detected based on a combination of a plurality of control elements, a processing abnormality can be detected with a high degree of accuracy.

As a specific example of synthetic judgment based on a combination of a plurality of control elements in the second embodiment, even when the concentration of an etching solution in the etching solution discharge and spread step is lower than a reference value, it is considered the etching solution provides an effect comparable to a reference value on a substrate W in the event that the etching solution discharge time is longer than a reference value. In this case, it is judged that no processing abnormality is present. Thus, in a combination of a plurality of control elements deviating from respective reference values by predetermined amounts or more, it is judged that no processing abnormality is present as long as effects caused by such deviation compensate each other. As a result, a processing abnormality can be detected with a high degree of accuracy.

Further, target substrates W are each subjected to constant monitoring and the collection of a plurality of control elements. Thus, in contrast to a conventional example which waits for inspection by a separate inspection unit, a processing abnormality can be detected without any delay.

In a cleaning process such as etching, of a series of foregoing process steps, the step of discharging and spreading an etching solution to coat a rotating substrate (step S12) and the step of discharging pure water (step S14) are the important steps exerting influence on the results of processing. After concentrated research, the present inventors found that the concentration of an etching solution and etching solution discharge time are the control elements largely exerting influence on the results of processing in the etching solution discharge and spread step, and that the number of revolutions of a substrate, the flow rate of pure water and pure water discharge time are the control elements largely exerting influence on the results of processing in the pure water discharge step.

In response, in the second embodiment, a combination of the concentration of an etching solution and etching solution discharge time is synthetically assessed to detect a processing abnormality in the etching solution discharge and spread step. In the pure water discharge step, a combination of the number of revolutions of a substrate, the flow rate of pure water and pure water discharge time is synthetically assessed to detect a processing abnormality. Thus, a processing abnormality in etching is detected based on a combination of important control elements in important steps largely exerting influence on the results of processing, thereby allowing detection of a processing abnormality with a higher degree of accuracy.

In the etching solution discharge and spread step, the number of revolutions of a substrate, the temperature, flow rate and concentration of an etching solution and etching solution discharge time are all desirably assessed as control elements to synthetically detect a processing abnormality. Alternatively, as in the second embodiment, at least two or more of these control elements may be monitored to detect an abnormality, in which case a processing abnormality can be detected more accurately as compared to a conventional way.

Like in the first embodiment, in the pure water discharge step, the number of revolutions of a substrate, the flow rate of pure water and pure water discharge time are all desirably assessed as control elements to synthetically detect a processing abnormality. Alternatively, at least two or more of these control elements may be monitored to detect an abnormality, in which case a processing abnormality can be detected more accurately as compared to a conventional way.

In the second embodiment, the use of hydrofluoric acid as an etching solution more effectively provides effects as discussed above than the use of hydrochloric acid. This is because the use of hydrochloric acid as an etching solution does not exert great influence on the results of processing even with the concentration of an etching solution and etching solution discharge time deviating from respective reference values to some extent. On the other hand, in the use of hydrofluoric acid, even slight deviation of the concentration of an etching solution and etching solution discharge time from respective reference values is likely to directly result in a processing abnormality such as overetching.

<3. Modifications>

The embodiments of the present invention have been described so far. However, the present invention is not limited to the foregoing examples. As an example, in each one of the foregoing embodiments, the data collection part 441 and the abnormality detection part 442 are provided in the data collection controller 4. Alternatively, they may be provided in the host computer 1 or in the maintenance server 2.

Figure 12:
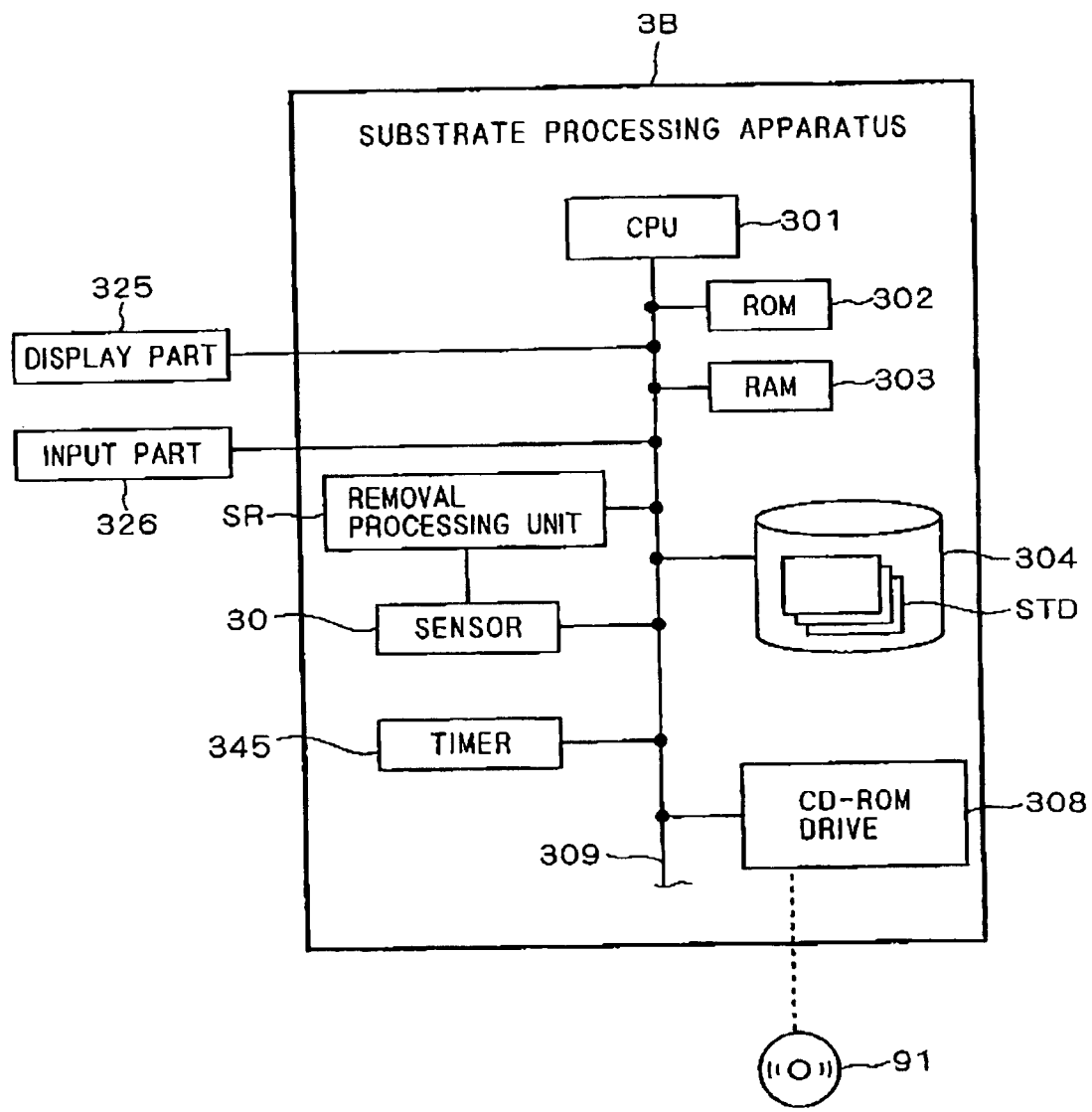
FIG. 12 is a block diagram showing another exemplary configuration of a substrate processing apparatus.

Still alternatively, the foregoing substance of processing discussed in each embodiment may be performed in one substrate processing apparatus 3. FIG. 12 is a block diagram showing another exemplary configuration of a substrate processing apparatus according to the present invention. In FIG. 12, the same constituent elements as those of FIG. 2 are designated by the same reference numerals.

A substrate processing apparatus 3B generally comprises a computer operative to function as a control unit for controlling the removal processing unit SR and the transport robot TR1. That is, the substrate processing apparatus 3B has a connection through a bus line 309 including a CPU 301 responsible for various types of computations, a ROM 302 as a read-only memory storing basic programs, a RAM 303 as a readable and writable memory storing various types of information, a magnetic disk 304 for storing control-specific software and data, and a CD-ROM drive 308.

The CD-ROM drive 308 reads a program recorded in a CD-ROM 91 containing each processing as discussed (such as collection of control elements and detection of a processing abnormality). The program read from the CD-ROM 91 by the CD-ROM drive 308 is installed in the substrate processing apparatus 3B and is then executed by the CPU 301, whereby the CPU 301 becomes operative to function in the same manner as the data collection part 441 and the abnormality detection part 442 to cause the substrate processing apparatus 3B to perform processing discussed below. For installation, this program may be downloaded from the host computer 1 and the like through a network. In place of the CD-ROM drive 308, other drives for other recording media such as a DVD drive may be used, in which case recording media to record the program are responsive to the type of each drive (in the case of a DVD drive, a DVD is used).

The connection through the bus line 309 also includes a display part 325 responsible for display of various types of information, and an input part 326 receiving input from an operator. The display part 325 and the input part 326 may be similar to the display part 25 and the input part 26 in each one of the foregoing embodiments. The removal processing unit SR and each sensor 30 are further electrically connected to the bus line 309, and are controlled by the CPU 301. A timer 345 having a timing mechanism is also connected to the bus line 309.

A series of process steps substantially the same as discussed in the first embodiment (FIGS. 5 and 6) is performed in the substrate processing apparatus 3B of FIG. 12. That is, the substrate processing apparatus 3B follows the process sequence in polymer removal exactly the same as that discussed with reference to FIG. 5. In the removal solution discharge and spread step (step S2) and in the pure water discharge step (step S4), the CPU 301 collects data indicative of a plurality of control elements and detects a processing abnormality in the substrate processing apparatus 3B based on the collected data of each control element. In the removal solution discharge and spread step, a combination of the number of revolutions of a substrate, the temperature and flow rate of a removal solution and removal solution discharge time is synthetically assessed to detect a processing abnormality. In the pure water discharge step, a combination of the number of revolutions of a substrate, the flow rate of pure water and pure water discharge time is synthetically assessed to detect a processing abnormality.

In the removal solution discharge and spread step, all control elements including the number of revolutions of a substrate, the temperature and flow rate of a removal solution and removal solution discharge time are also preferably assessed as a combination to detect a processing abnormality. Alternatively, at least two or more of these control elements may be monitored to detect an abnormality, in which case a processing abnormality can be detected more accurately as compared to a conventional way.

Similarly, in the pure water discharge step, all the control elements including the number of revolutions of a substrate, the flow rate of pure water and pure water discharge time are also preferably assessed as a combination to detect a processing abnormality. Alternatively, at least two or more of these control elements may be monitored to detect an abnormality, in which case a processing abnormality can be detected more accurately as compared to a conventional way.

Like in the first embodiment, it is also allowed to avoid undesirables occurring in the cases where processing giving rise to no problem as a whole even with control elements each deviating from a reference value is detected as a processing abnormality, or conversely, processing containing abnormality as a whole is not detected as an abnormality. Thus a processing abnormality can be readily detected with a higher degree of accuracy.

Alternatively, the etching processing unit MP of the second embodiment may be incorporated into FIG. 12 in place of the removal processing unit SR to perform a series of process steps substantially the same as discussed in the second embodiment (FIGS. 10 and 11) in the substrate processing apparatus 3B. That is, the substrate processing apparatus 3B follows the process sequence in etching exactly the same as that discussed with reference to FIG. 10. In the etching solution discharge and spread step (step S12) and in the pure water discharge step (step S 14), the CPU 301 collects data indicative of a plurality of control elements and detects a processing abnormality in the substrate processing apparatus 3B based on the collected data of each control element. In the etching solution discharge and spread step, a combination of the number of revolutions of a substrate, the temperature, flow rate and concentration of an etching solution, and etching solution discharge time is synthetically asses to detect a processing abnormality. In pure water discharge step, a combination of the number of revolutions of a substrate, the flow rate of pure water and pure water discharge time is synthetically assessed to detect a processing abnormality.

In the etching solution discharge and spread step, all control elements including the number of revolutions of a substrate, the temperature, flow rate and concentration of an etching solution and etching solution discharge time are also preferably assessed as a combination to detect a processing abnormality. Alternatively, at least two or more of these control elements may be monitored to detect an abnormality, in which case a processing abnormality can be detected more accurately as compared to a conventional way.

Similarly, in the pure water discharge step, all the control elements including the number of revolutions of a substrate, the flow rate of pure water and pure water discharge time are also preferably assessed as a combination to detect a processing abnormality. Alternatively, at least two or more of these control elements may be monitored to detect an abnormality, in which case a processing abnormality can be detected more accurately as compared to a conventional way.

Like in the second embodiment, it is also allowed to avoid undesirables occurring in the cases where processing giving rise to no problem as a whole even with control elements each deviating from a reference value is detected as a processing abnormality, or conversely, processing containing abnormality as a whole is not detected as an abnormality. Thus a processing abnormality can be readily detected with a higher degree of accuracy.

The technique according to the present invention is applicable to a substrate processing apparatus in which a certain processing solution is discharged onto a rotating substrate to perform predetermined processing which is not limited to polymer removal and etching, and to a system in general having a connection between the substrate processing apparatus and the data collection controller 4. Especially in an apparatus discharging a cleaning solution onto a rotating substrate and thereafter discharging pure water to clean the substrate, a step of discharging and spreading a cleaning solution and a step of discharging pure water are the important steps exerting influence on the results of processing. Thus the present invention can be effectively applied to such an apparatus. As a cleaning solution, a chemical solution such as a mixture of ammonia and hydrogen peroxide may be used in addition to a polymer removal solution and an etching solution as discussed. As an example of a substrate processing apparatus using such a chemical solution, a single-substrate type substrate processing apparatus may be used in which the chemical solution is discharged onto a rotating substrate and thereafter, the substrate is cleaned by rinsing using pure water. A plurality of control elements in the step of discharging and spreading a chemical solution and the rinsing step using pure water are collected and then synthetically assessed as a combination, whereby a processing abnormality can be readily detected with a high degree of accuracy.

In an apparatus discharging photoresist onto a rotating substrate to perform resist coating, a plurality of control elements in a step of discharging and spreading photoresist are collected and then synthetically assessed as a combination to readily detect a processing abnormality with a high degree of accuracy.

That is, in a substrate processing apparatus in which a certain processing solution such as a cleaning solution, pure water, photoresist and the like is discharged onto a rotating substrate to perform predetermined processing, a plurality of control elements in a step of discharging the processing solution are collected and then synthetically assessed as a combination, whereby a processing abnormality can be readily detected with a high degree of accuracy.

An object to be processed in the substrate processing apparatus of the present invention is not limited to a semiconductor substrate. A glass substrate for a liquid crystal display, a glass substrate for a photomask, a substrate for an optical disk or the like are alternative objects to be processed.

The invention claimed is:

1. A substrate processing system comprising a network having a coupling between a substrate processing apparatus discharging a processing solution onto a rotating substrate to perform predetermined processing, and a computer collecting data from said substrate processing apparatus, said substrate processing system comprising:

a collection part configured to monitor and collect a plurality of control elements in a specific step as one process of said predetermined processing in said substrate processing apparatus; and an abnormality detection part comprising an abnormality detection program configured to detect a processing abnormality in said substrate processing apparatus based on a combined effect of said plurality of control elements collected by said collection part, the abnormality detection program being configured to detect that a first control element of the plurality of control elements deviates from a first reference value by an amount sufficient to determine a presence of an abnormality, and to determine an absence of the processing abnormality in processing as a whole when a second control element of the plurality of control elements deviates from a respective reference value by a predetermined amount or more and the abnormality detection program determines that effects caused by such deviations compensate each other, and the abnormality detection program being further configured to permit continuation of the predetermined processing by the substrate processing apparatus based on the determination of the absence of the processing abnormality in the processing as the whole, wherein said substrate processing apparatus discharges a cleaning solution and thereafter discharges pure water onto a rotating substrate to perform cleaning of said substrate, wherein said collection part monitors and collects the plurality of control elements in a cleaning solution spread step in which said cleaning solution is discharged and spread to coat the rotating substrate, and wherein said abnormality detection part detects a processing abnormality in said cleaning based on a combined effect of two or more of said plurality of control elements in said cleaning solution spread step, the plurality of control elements including the number of revolutions of a substrate, the temperature, flow rate and concentration of the cleaning solution, and cleaning solution discharge time.

2. The substrate processing system according to claim 1, wherein said collection part monitors and collects the plurality of control elements in a pure water discharge step in which pure water is discharged onto the rotating substrate, and wherein said abnormality detection part detects a processing abnormality in said cleaning based on a combined effect of two or more of said plurality of control elements in said pure water discharge step, the plurality of control elements including the number of revolutions of a substrate, the flow rate of pure water and pure water discharge time.

3. The substrate processing system according to claim 2, wherein said cleaning solution is a polymer removal solution, wherein said substrate processing apparatus discharges said polymer removal solution and thereafter discharges pure water onto the rotating substrate to perform polymer removal of said substrate, wherein said collection part monitors and collects the flow rate and discharge time of a removal solution as a plurality of control elements in a removal solution spread step in which said polymer removal solution is discharged and spread to coat a rotating substrate, and wherein said abnormality detection part detects a processing abnormality in said polymer removal based on a combined effect of the flow rate and discharge time of said removal solution in said removal solution spread step.

4. The substrate processing system according to claim 2, wherein said cleaning solution is an etching solution, wherein said substrate processing apparatus discharges said etching solution and thereafter discharges pure water onto a rotating substrate to perform etching of said substrate, wherein said collection part monitors and collects the concentration and discharge time of an etching solution as the plurality of control elements in an etching solution spread step in which said etching solution is discharged and spread to coat a rotating substrate, and wherein said abnormality detection part detects a processing abnormality in said etching based on a combined effect of the concentration and discharge time of said etching solution in said etching solution spread step.

5. The substrate processing system according to claim 4, wherein said etching solution is hydrofluoric acid.

6. The substrate processing system according to claim 4, wherein said etching solution is hydrochloric acid.

7. The substrate processing system according to claim 4, wherein said substrate processing apparatus comprises a circulation mechanism configured to collect spent etching solution discharged once onto the substrate and to mix said spent etching solution with new etching solution for use in circulation.

8. The substrate processing system according to claim 7, wherein said etching solution is hydrofluoric acid.

9. The substrate processing system according to claim 7, wherein said etching solution is hydrochloric acid.

10. A substrate processing apparatus discharging a processing solution onto a rotating substrate to perform predetermined processing, comprising:

a collection part configured to monitor and collect a plurality of control elements in a specific step as one process of said predetermined processing; and an abnormality detection part comprising an abnormality detection program configured to detect a processing abnormality in said processes based on a combined effect of said plurality of control elements collected by said collection part, the abnormality detection program being configured to detect that a first control element of the plurality of control elements deviates from a first reference value by an amount sufficient to determine a presence of an abnormality, and to determine an absence of the processing abnormality in processing as a whole when a second control element of the plurality of control elements deviates from a respective reference value by a predetermined amount or more and the abnormality detection program determines that effects caused by such deviations compensate each other, and the abnormality detection program being further configured to permit continuation of the predetermined processing by the substrate processing apparatus based on the determination of the absence of the processing abnormality in the processing as the whole, wherein said predetermined processing is cleaning by discharging a cleaning solution and thereafter discharging pure water onto a rotating substrate to clean said substrate, wherein said collection part monitors and collects the plurality of control elements in a cleaning solution spread step in which said cleaning solution is discharged and spread to coat the rotating substrate, and wherein said abnormality detection part detects a processing abnormality in said cleaning based on a combined effect of two or more of said plurality of control elements in said cleaning solution spread step, the plurality of control elements including the number of revolutions of a substrate, the temperature, flow rate and concentration of the cleaning solution, and cleaning solution discharge time.

11. The substrate processing apparatus according to claim 10, wherein said collection part monitors and collects the plurality of control elements in a pure water discharge step in which pure water is discharged onto the rotating substrate, and wherein said abnormality detection part detects a processing abnormality in said cleaning based on a combined effect of two or more of said plurality of control elements in said pure water discharge step, the plurality of control elements including the number of revolutions of a substrate, the flow rate of pure water and pure water discharge time.

12. The substrate processing apparatus according to claim 11, wherein said cleaning solution is a polymer removal solution, wherein said predetermined processing is polymer removal by discharging said polymer removal solution and thereafter discharging pure water onto the rotating substrate to clean said substrate, wherein said collection part monitors and collects the flow rate and discharge time of a removal solution as a plurality of control elements in a removal solution spread step in which said polymer removal solution is discharged and spread to coat a rotating substrate, and wherein said abnormality detection part detects a processing abnormality in said polymer removal based on a combined effect of the flow rate and discharge time of said removal solution in said removal solution spread step.

13. The substrate processing apparatus according to claim 11, wherein said cleaning solution is an etching solution, wherein said predetermined processing is etching by discharging said etching solution and thereafter discharging pure water onto a rotating substrate to clean said substrate, wherein said collection part monitors and collects the concentration and discharge time of an etching solution as the plurality of control elements in an etching solution spread step in which said etching solution is discharged and spread to coat a rotating substrate, and wherein said abnormality detection part detects a processing abnormality in said etching based on a combined effect of the concentration and discharge time of said etching solution in said etching solution spread step.

14. The substrate processing apparatus according to claim 13, wherein said etching solution is hydrofluoric acid.

15. The substrate processing apparatus according to claim 13, wherein said etching solution is hydrochloric acid.

16. The substrate processing apparatus according to claim 13, comprising:

a circulation mechanism configured to collect spent etching solution discharged once onto the substrate and to mix said spent etching solution with new etching solution for use in circulation.

17. The substrate processing apparatus according to claim 16, wherein said etching solution is hydrofluoric acid.

18. The substrate processing apparatus according to claim 16, wherein said etching solution is hydrochloric acid.

* * * * *